(12) United States Patent
Sekiguchi et al.

(10) Patent No.: US 11,515,120 B2
(45) Date of Patent: Nov. 29, 2022

(54) CHARGED PARTICLE BEAM APPARATUS

(71) Applicant: HITACHI HIGH-TECH CORPORATION, Tokyo (JP)

(72) Inventors: Yoshifumi Sekiguchi, Tokyo (JP); Shin Imamura, Tokyo (JP); Shunsuke Mizutani, Tokyo (JP); Shahedul Hoque, Tokyo (JP); Uki Ikeda, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 102 days.

(21) Appl. No.: 17/269,424

(22) PCT Filed: Sep. 21, 2018

(86) PCT No.: PCT/JP2018/035048
§ 371 (c)(1),
(2) Date: Feb. 18, 2021

(87) PCT Pub. No.: WO2020/059114
PCT Pub. Date: Mar. 26, 2020

(65) Prior Publication Data
US 2021/0183614 A1    Jun. 17, 2021

(51) Int. Cl.
*H01J 37/244* (2006.01)
*G01N 23/2251* (2018.01)
*G02B 6/42* (2006.01)

(52) U.S. Cl.
CPC ........ *H01J 37/244* (2013.01); *G01N 23/2251* (2013.01); *G02B 6/4214* (2013.01);
(Continued)

(58) Field of Classification Search
CPC ............ H01J 37/244; H01J 2237/2443; H01J 2237/24465; H01J 2237/281;
(Continued)

(56) References Cited

U.S. PATENT DOCUMENTS 6,211,525 B1 * 4/2001 Cowham ............... H01J 37/244
250/397
6,730,907 B1 * 5/2004 Feuerbaum ........... H01J 37/244
250/397
(Continued)

FOREIGN PATENT DOCUMENTS

JP    S54-019658 A    2/1979
JP    S58-174855 A    11/1983
(Continued)

OTHER PUBLICATIONS

L. Reimer, "Scanning Electron Microscopy" (1998, Springer) (pp. 298-299).
(Continued)

*Primary Examiner* — David A Vanore
(74) *Attorney, Agent, or Firm* — Volpe Koenig

(57) ABSTRACT

A charged particle beam apparatus using a light guide that improves light utilization efficiency includes a detector including a scintillator for emitting light when a charged particle is incident, a light receiving element, and a light guide for guiding the light from the scintillator to the light receiving element. The light guide includes: an incident surface that faces a light emitting surface of the scintillator and to which the light emitted by the scintillator is incident; an emitting surface that is configured to emit light; and a reflecting surface that is inclined with respect to the incident surface so that the light from the incident surface is reflected toward the emitting surface. The emitting surface is smaller than the incident surface. A slope surface is provided between the incident surface and the emitting surface, faces the reflecting surface, and is inclined with respect to the incident surface.

13 Claims, 23 Drawing Sheets

(52) U.S. Cl.
CPC ... *G01N 2223/07* (2013.01); *G01N 2223/418* (2013.01); *G01N 2223/505* (2013.01); *G01N 2223/507* (2013.01)

(58) Field of Classification Search
CPC .......... G01N 23/2251; G01N 2223/07; G01N 2223/418; G01N 2223/505; G01N 2223/507; G02B 6/4214
See application file for complete search history.

(56) References Cited

U.S. PATENT DOCUMENTS

| | | | | |
|---|---|---|---|---|
| 7,462,839 | B2* | 12/2008 | Gnauck | H01J 37/244 250/397 |
| 7,928,383 | B2 | 4/2011 | Wang et al. | |
| 2002/0134937 | A1* | 9/2002 | Taylor | H01J 37/244 250/311 |
| 2002/0168317 | A1* | 11/2002 | Daighighian | A61K 49/18 600/407 |
| 2002/0171030 | A1* | 11/2002 | Howells | H01J 37/244 250/201.3 |
| 2003/0085361 | A1* | 5/2003 | Howells | H01J 37/244 250/397 |
| 2005/0173644 | A1* | 8/2005 | Gnauck | H01J 37/244 250/370.11 |
| 2008/0315094 | A1* | 12/2008 | Wang | H01J 37/28 250/311 |
| 2010/0237251 | A1* | 9/2010 | Tonami | G01T 1/1642 250/361 R |
| 2011/0139984 | A1* | 6/2011 | Kurata | H01J 37/244 250/368 |
| 2016/0155526 | A1* | 6/2016 | Arimoto | C09K 11/628 250/488.1 |
| 2016/0379797 | A1* | 12/2016 | Nomaguchi | H01J 37/1471 250/368 |
| 2016/0379798 | A1 | 12/2016 | Shishido et al. | |
| 2017/0069458 | A1 | 3/2017 | Shouji et al. | |
| 2017/0307765 | A1* | 10/2017 | Bures | G01T 1/2002 |
| 2018/0136344 | A1* | 5/2018 | Nelson | A61B 6/037 |
| 2018/0172849 | A1* | 6/2018 | Nelson | G01T 1/2018 |
| 2018/0240644 | A1* | 8/2018 | Kuramoto | H01J 37/244 |
| 2019/0115186 | A1 | 4/2019 | Sekiguchi et al. | |
| 2019/0259571 | A1* | 8/2019 | Cheifetz | H01J 37/244 |
| 2020/0108278 | A1* | 4/2020 | Friedman | A61N 5/1045 |
| 2020/0312609 | A1* | 10/2020 | Shur | H01J 37/222 |
| 2021/0183614 | A1* | 6/2021 | Sekiguchi | H01J 37/244 |
| 2021/0280386 | A1* | 9/2021 | Brodie | H01J 37/226 |

FOREIGN PATENT DOCUMENTS

| | | |
|---|---|---|
| JP | 2012-500447 A | 1/2012 |
| JP | 2015-106530 A | 6/2015 |
| JP | 2015-153710 A | 8/2015 |
| JP | 2017-183126 A | 10/2017 |

OTHER PUBLICATIONS

International Search Report and English Translation, PCT/JP2018/035048, dated Nov. 20, 2018 (4 pgs.).

* cited by examiner

[FIG. 1]
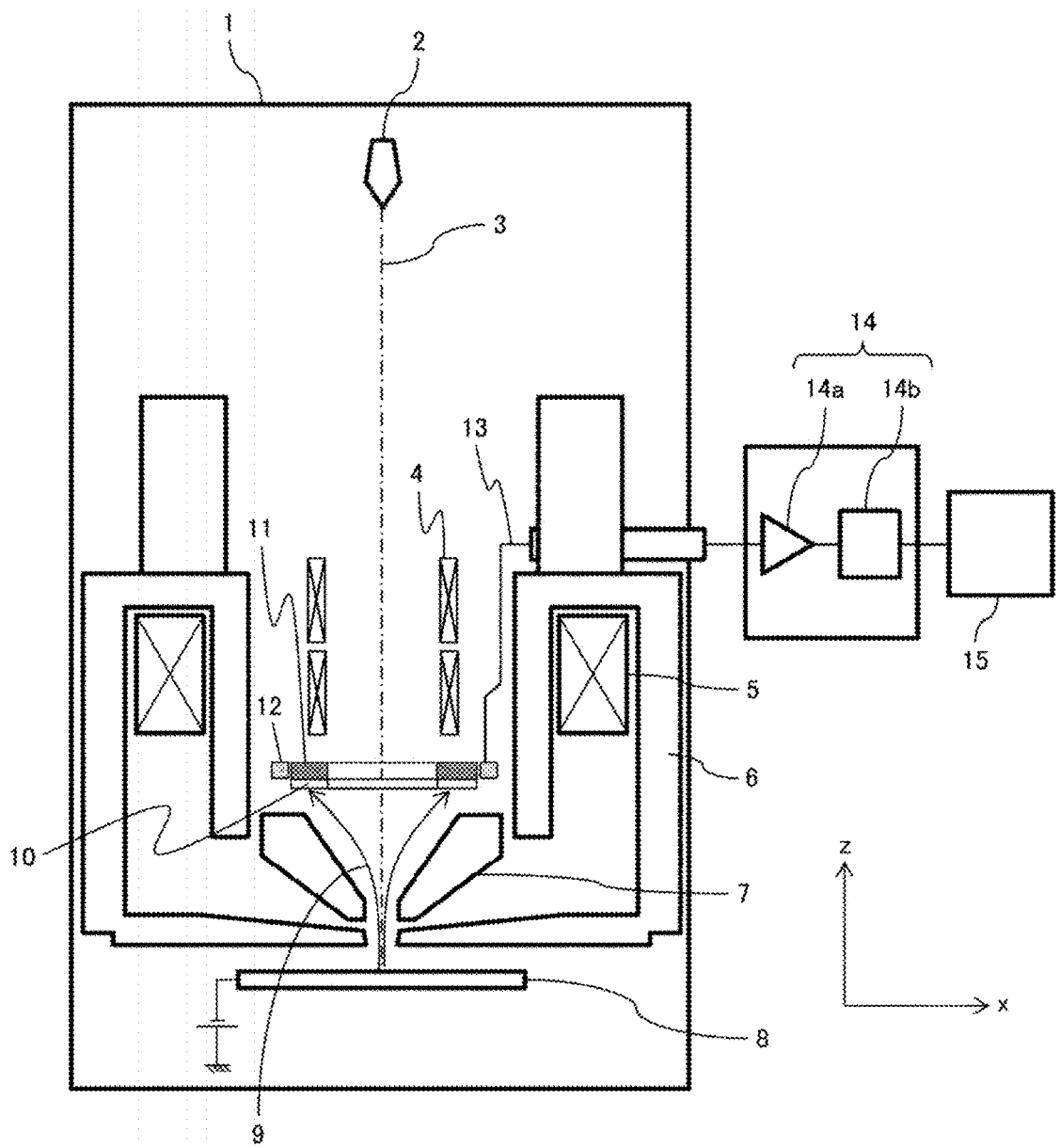

[FIG. 2]
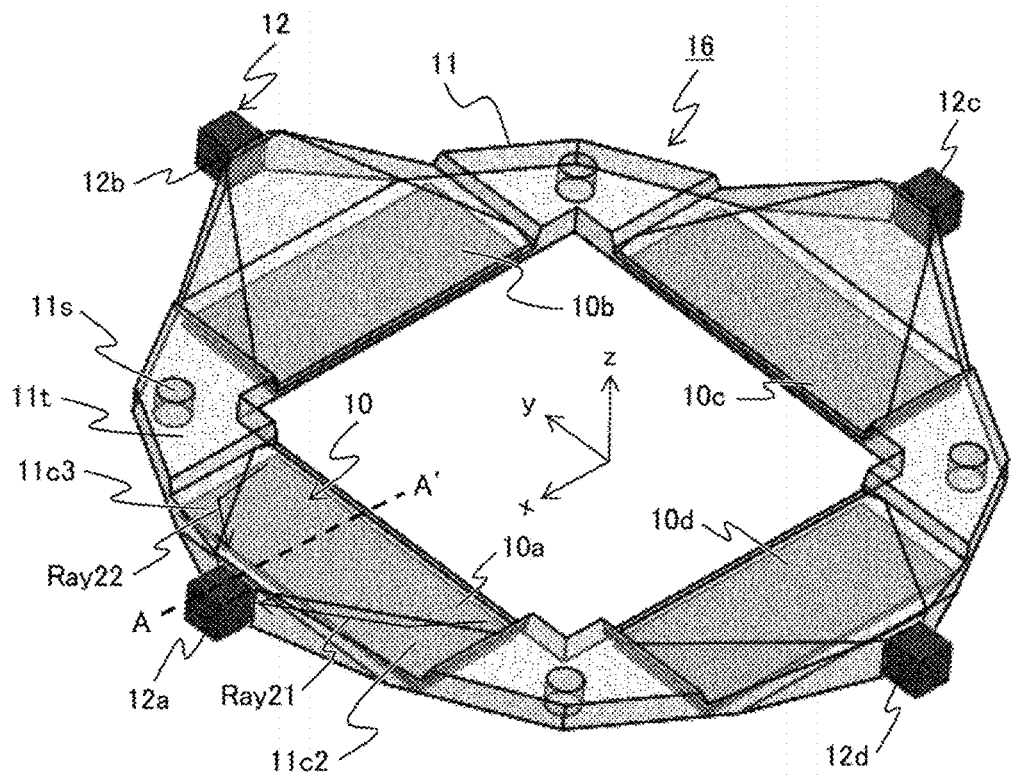
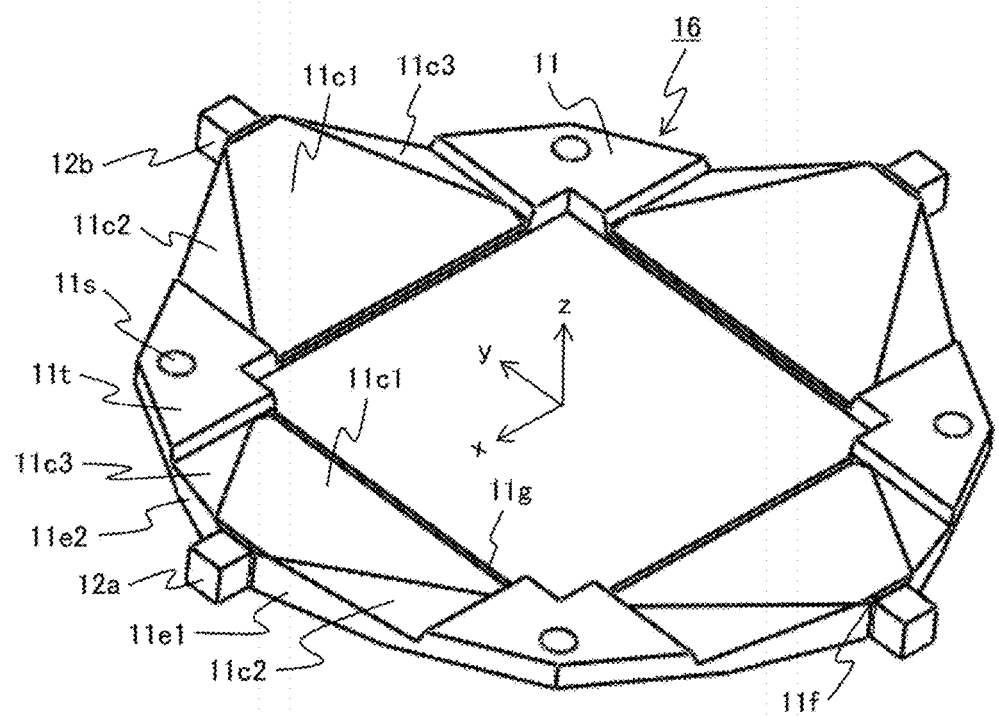

[FIG. 3]
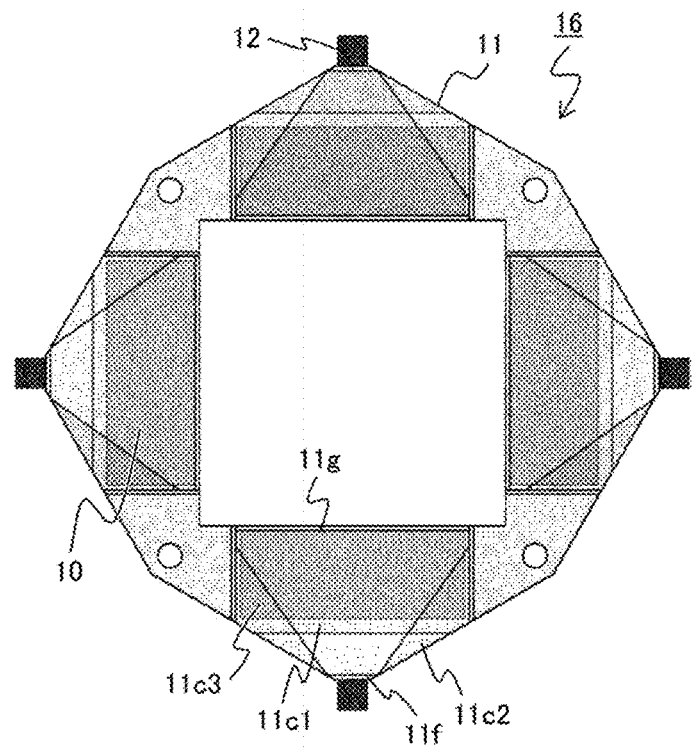
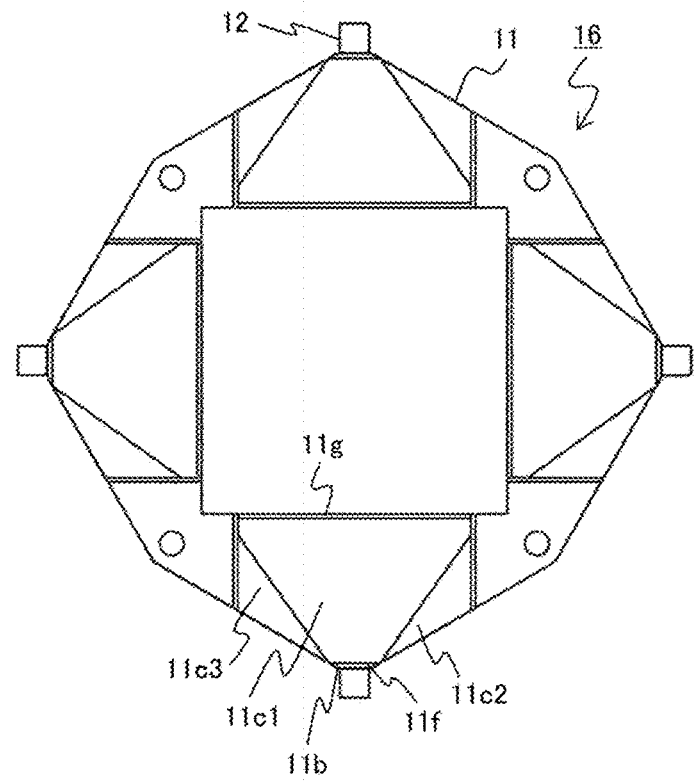

[FIG. 4]
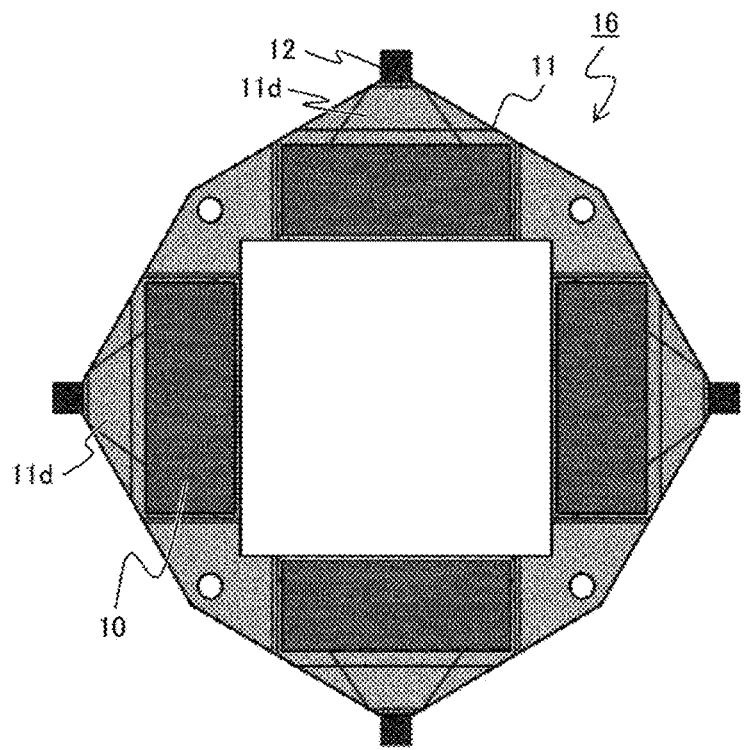
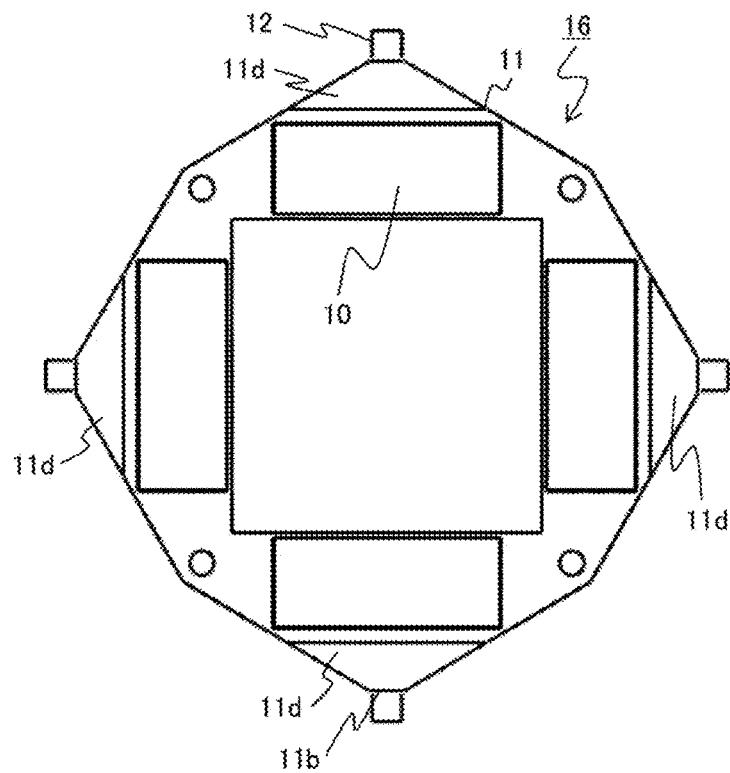

[FIG. 5]
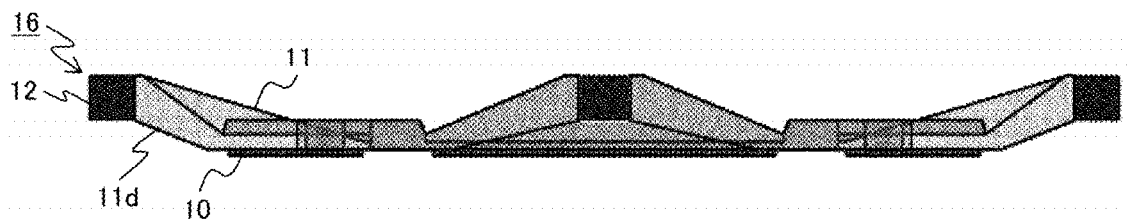
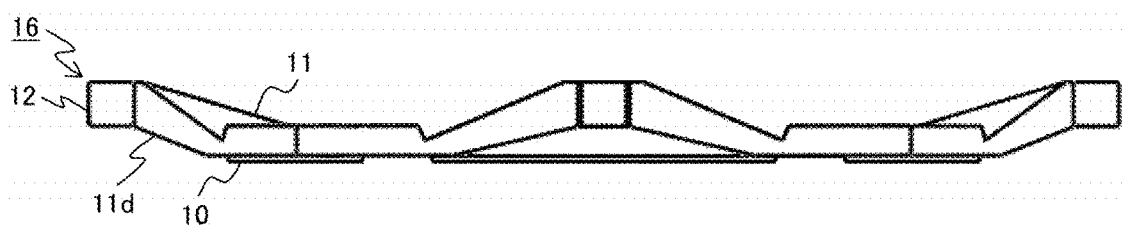
[FIG. 6]
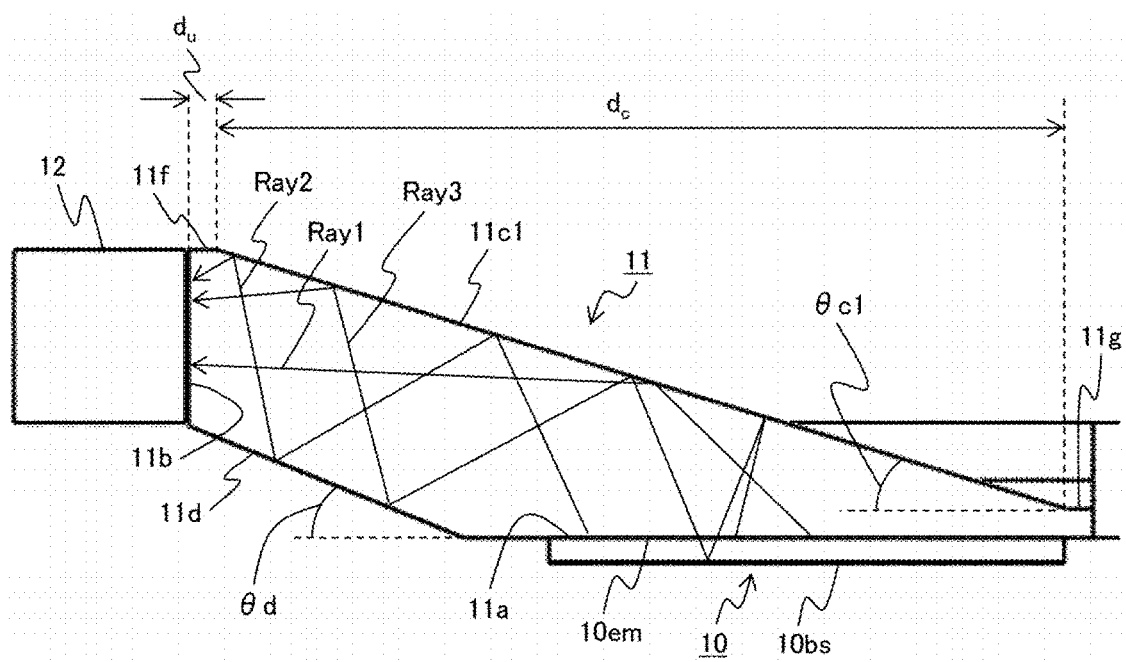

[FIG. 7]
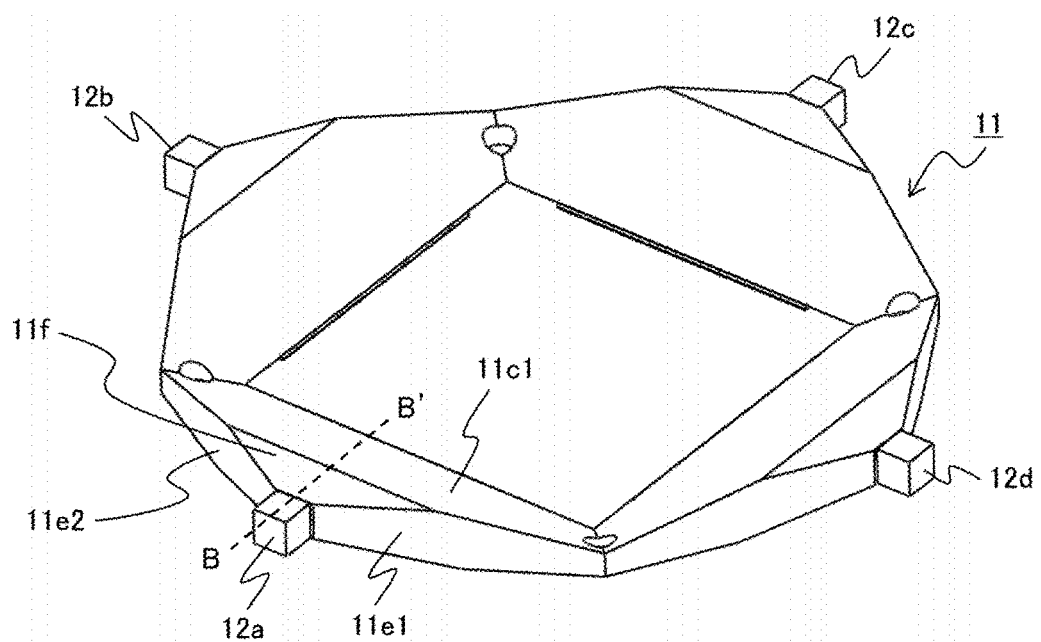

[FIG. 8]
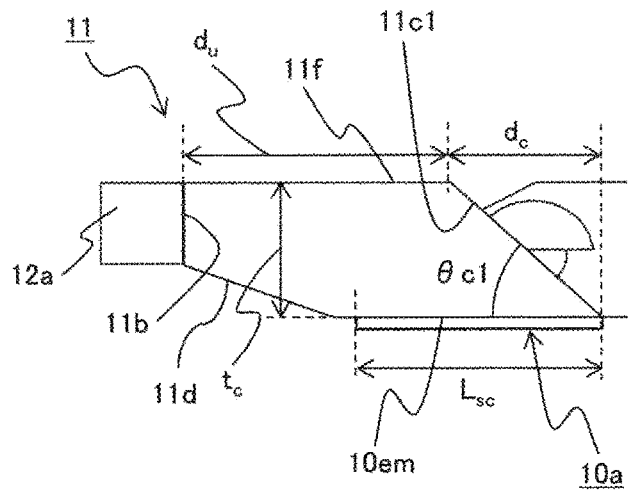
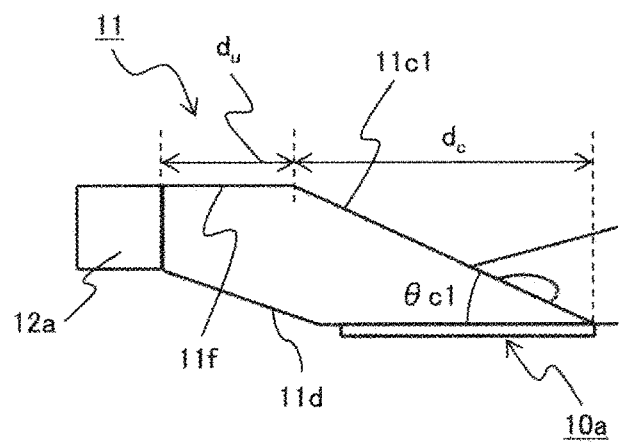
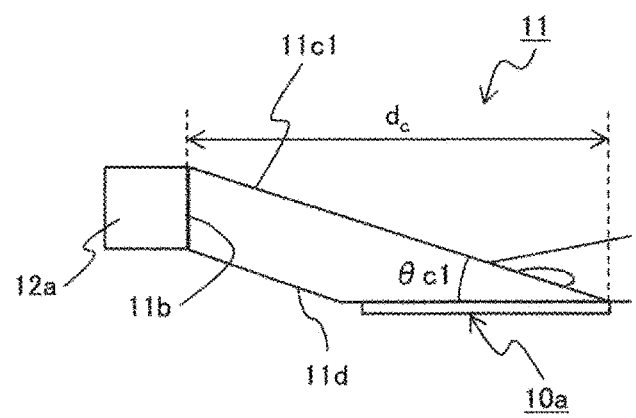

[FIG. 9]
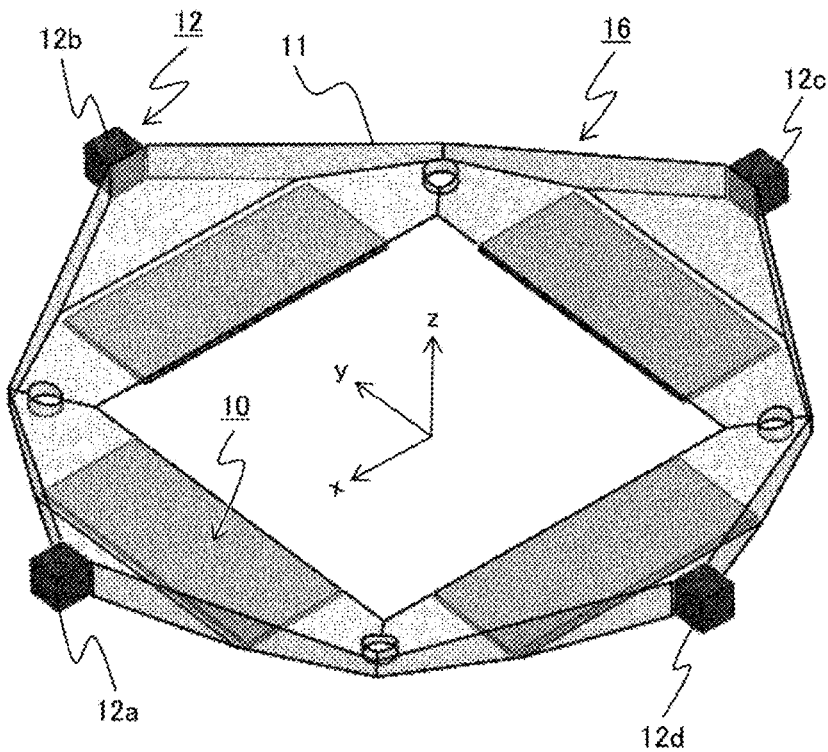
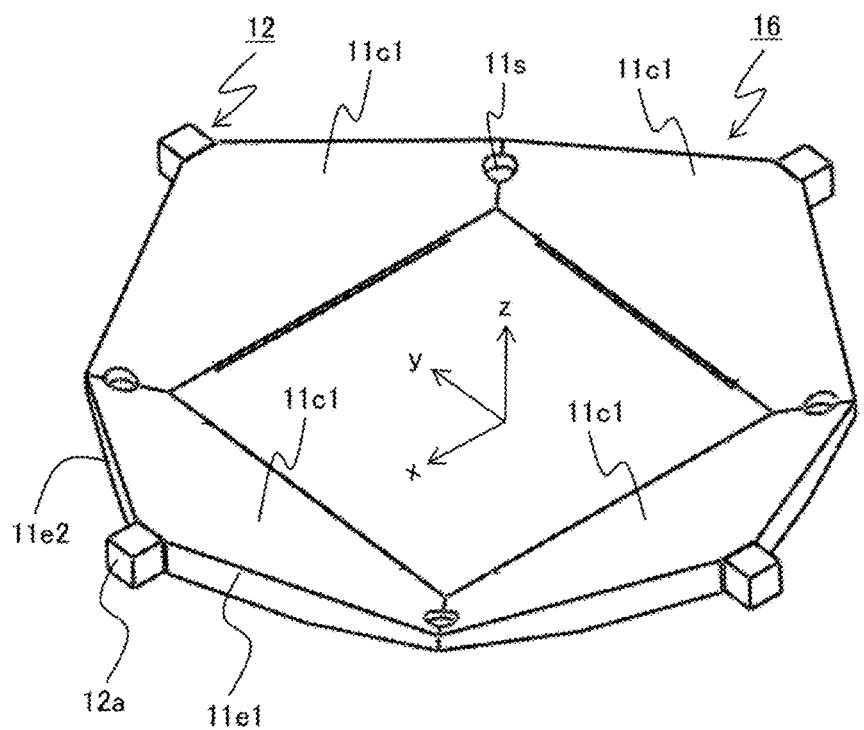

[FIG. 10]
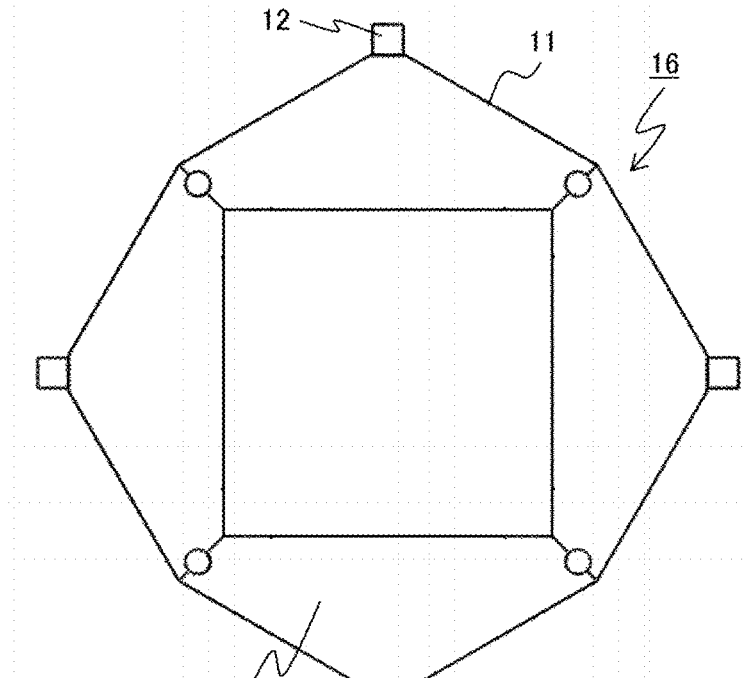
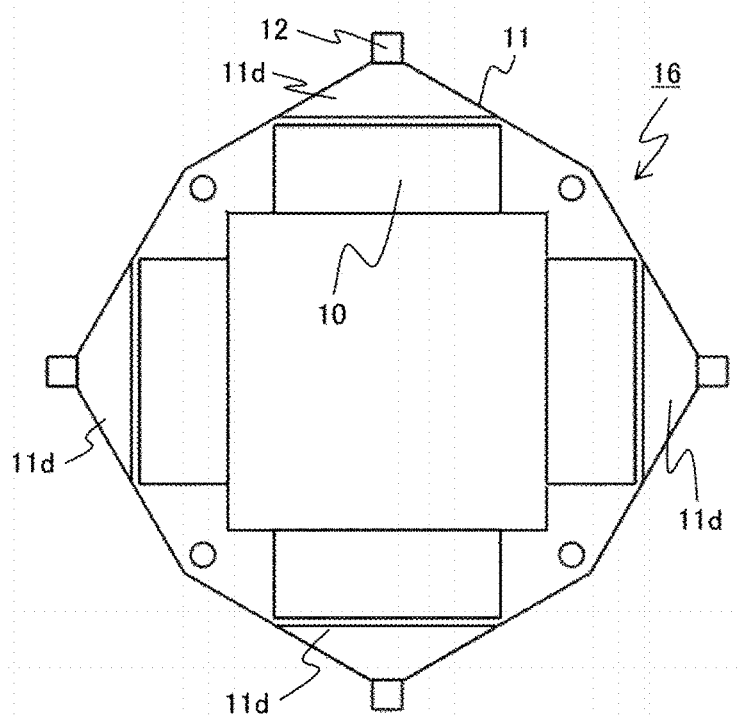

[FIG. 11]
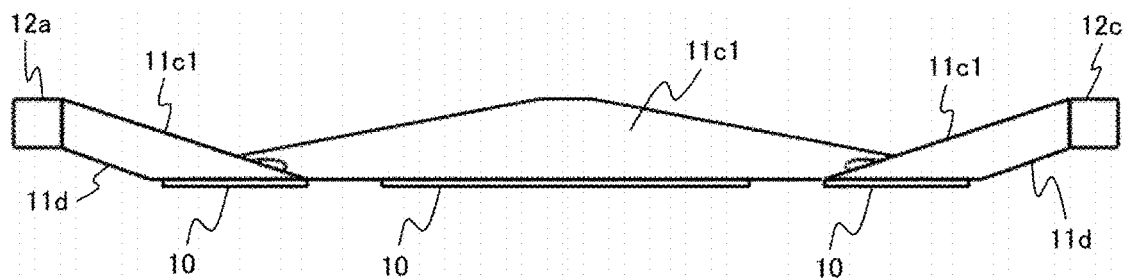
[FIG. 12]
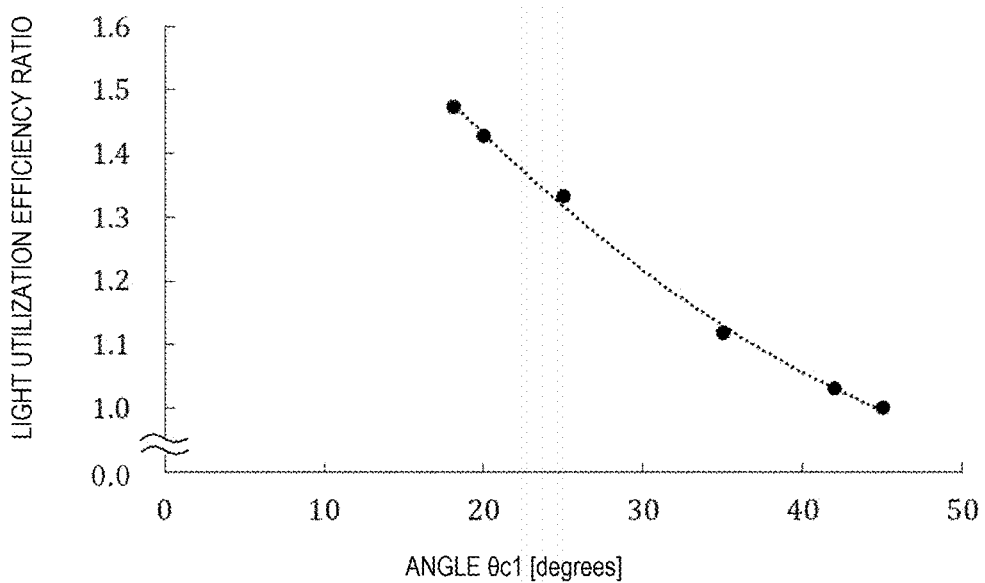

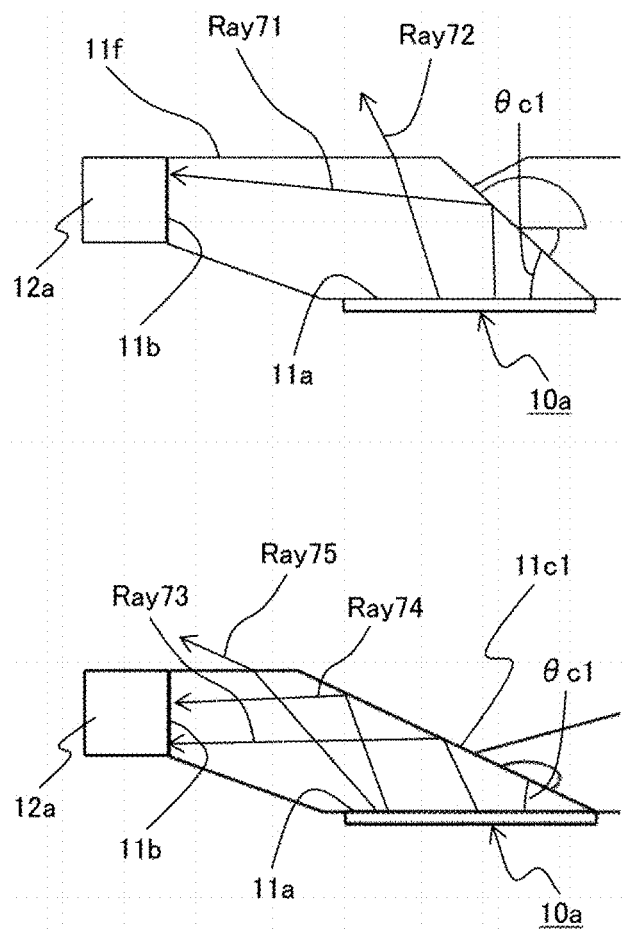
[FIG. 13]

[FIG. 14]
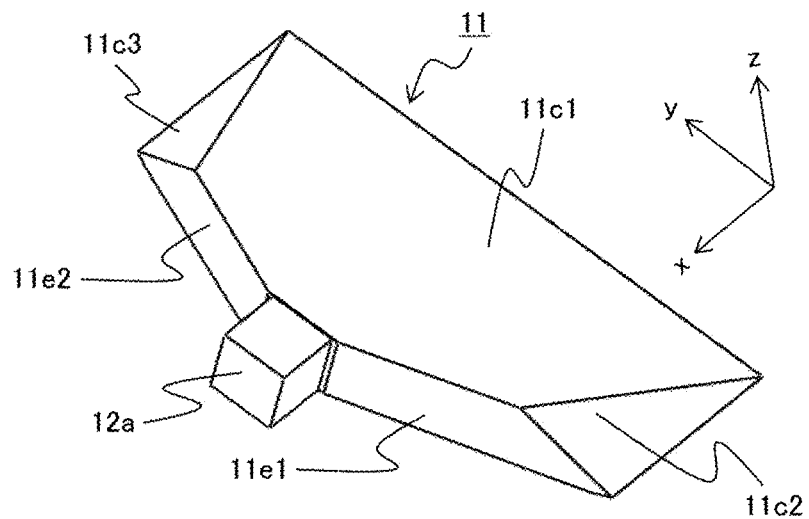
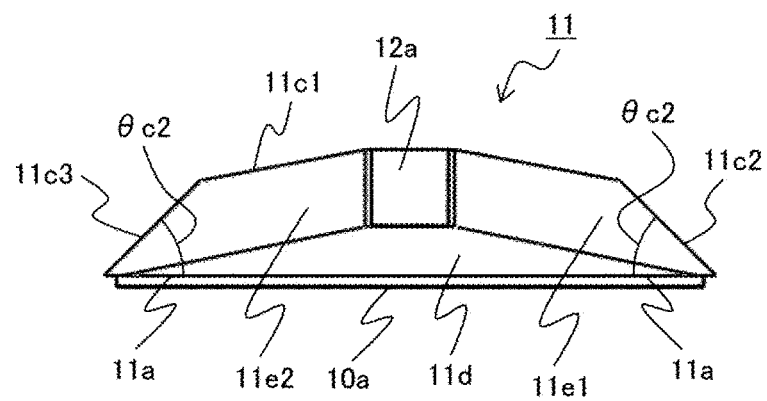

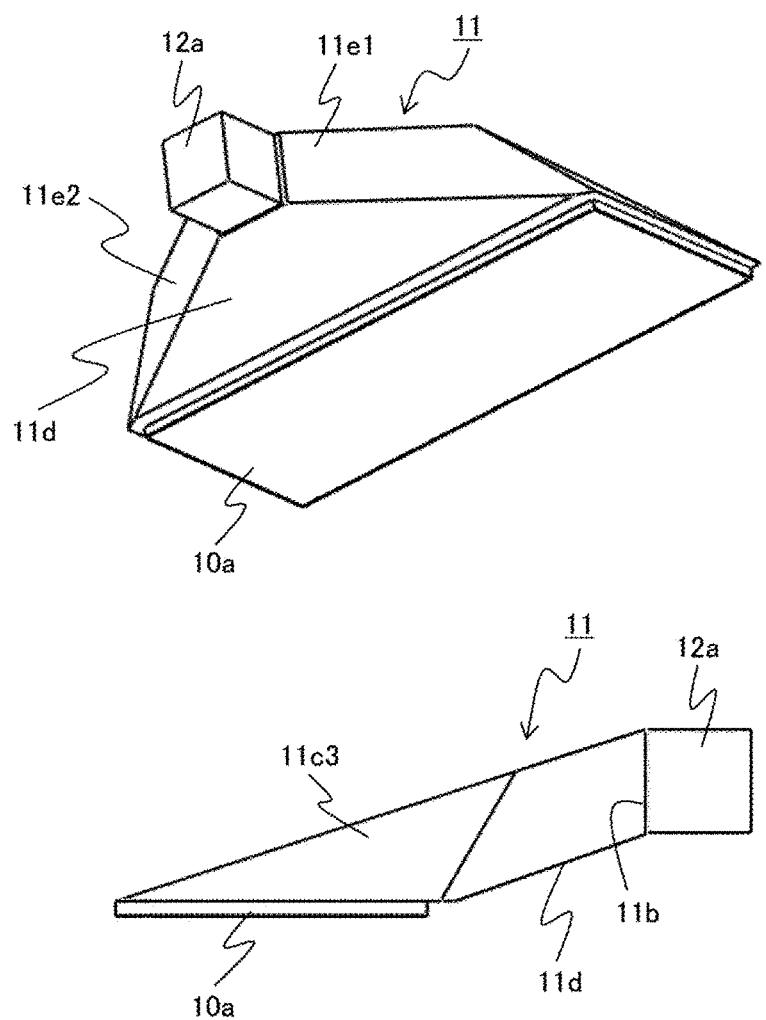
[FIG. 15]

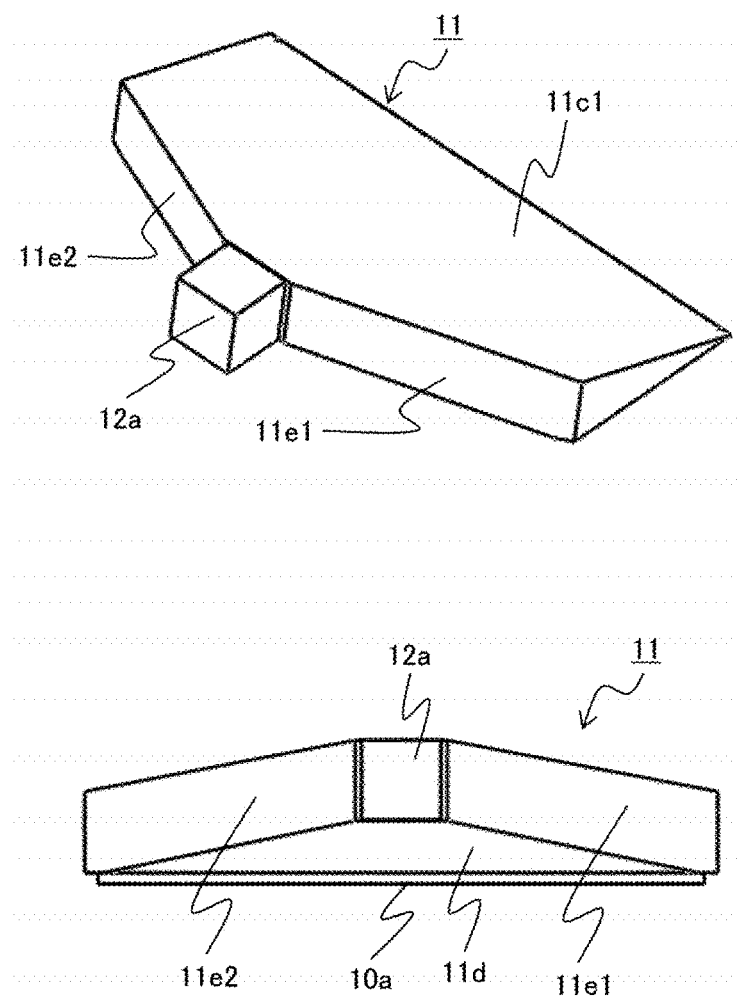
[FIG. 16]

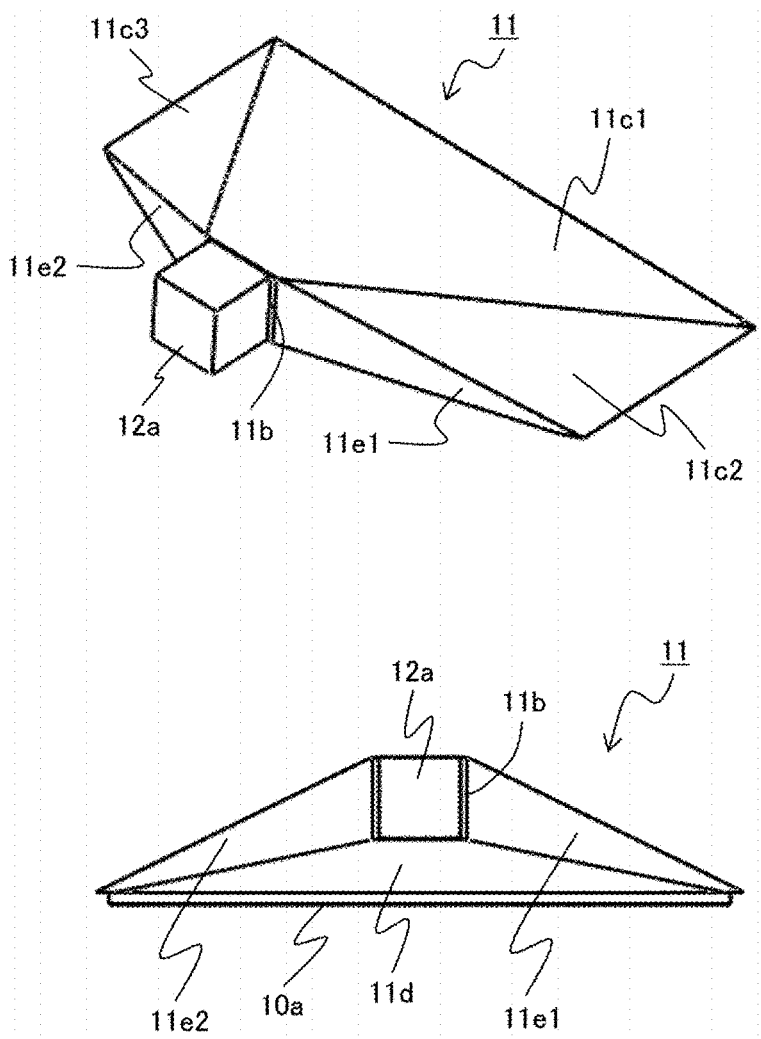
[FIG. 17]

[FIG. 18]
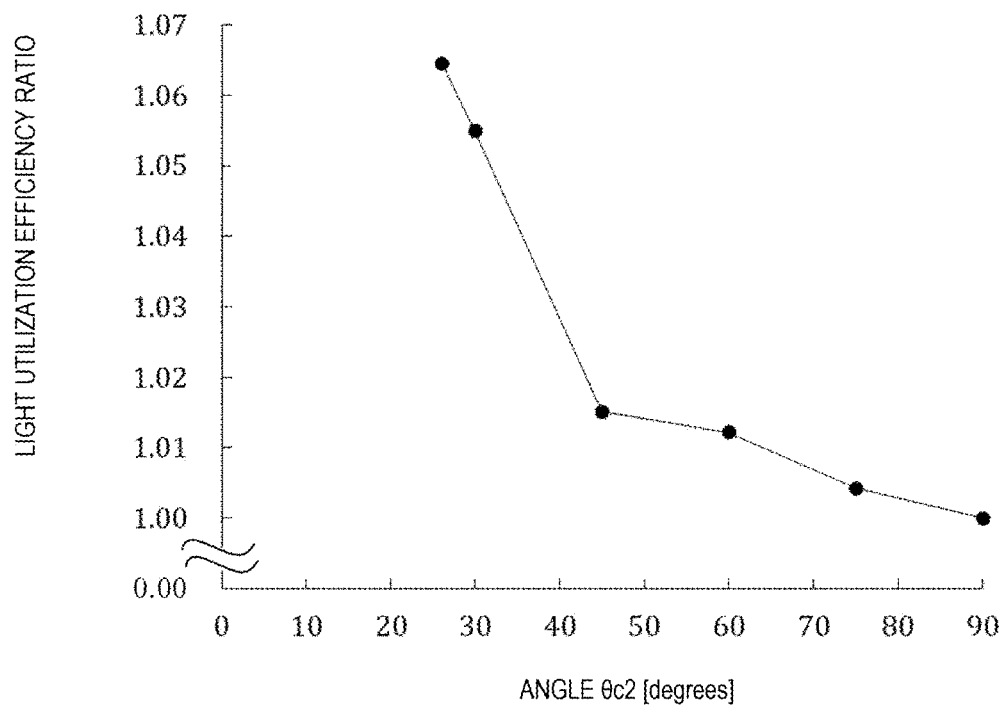

[FIG. 19]
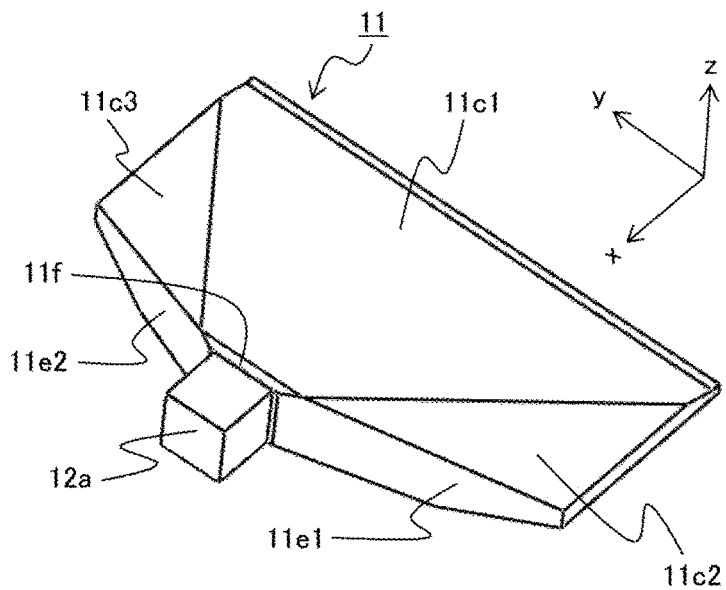
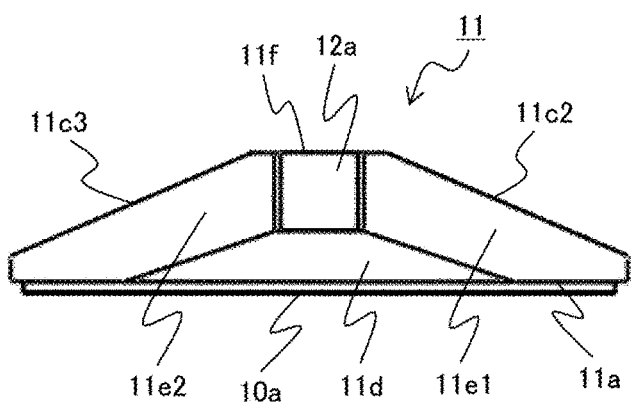

[FIG. 20]
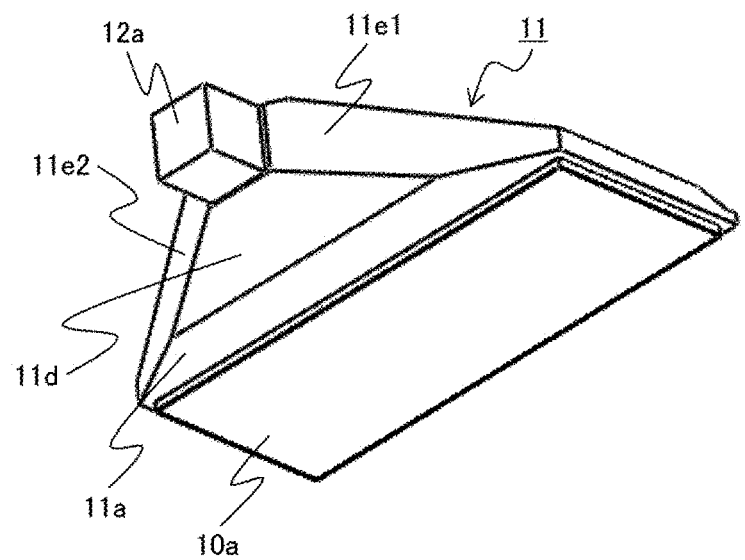
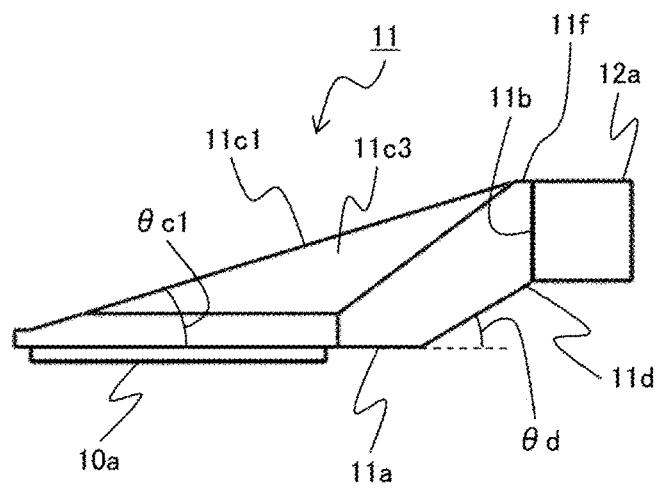

[FIG. 21]
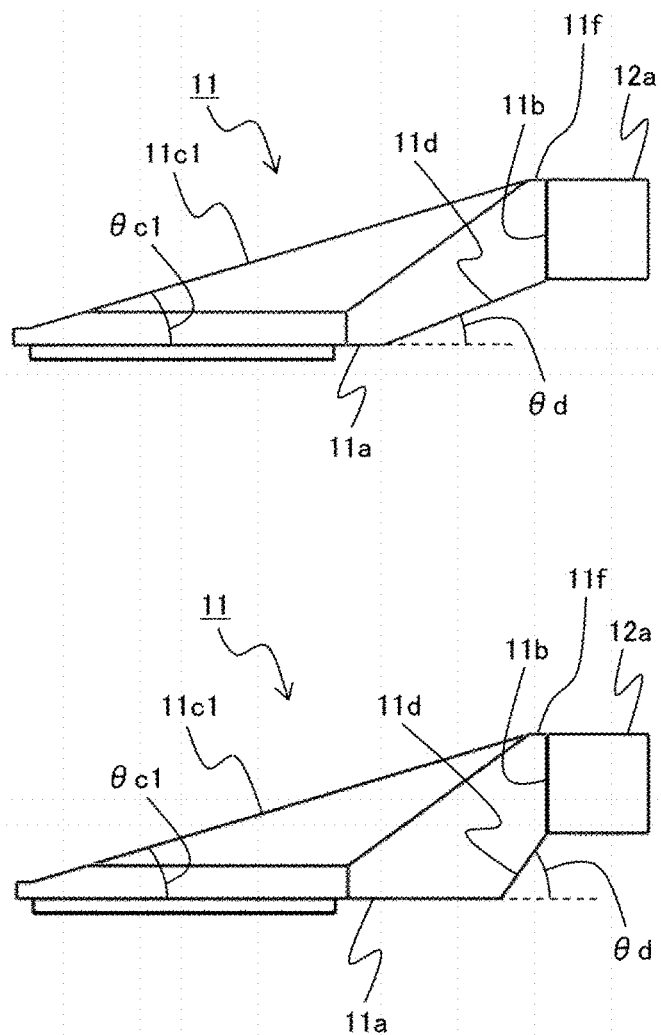

[FIG. 22]
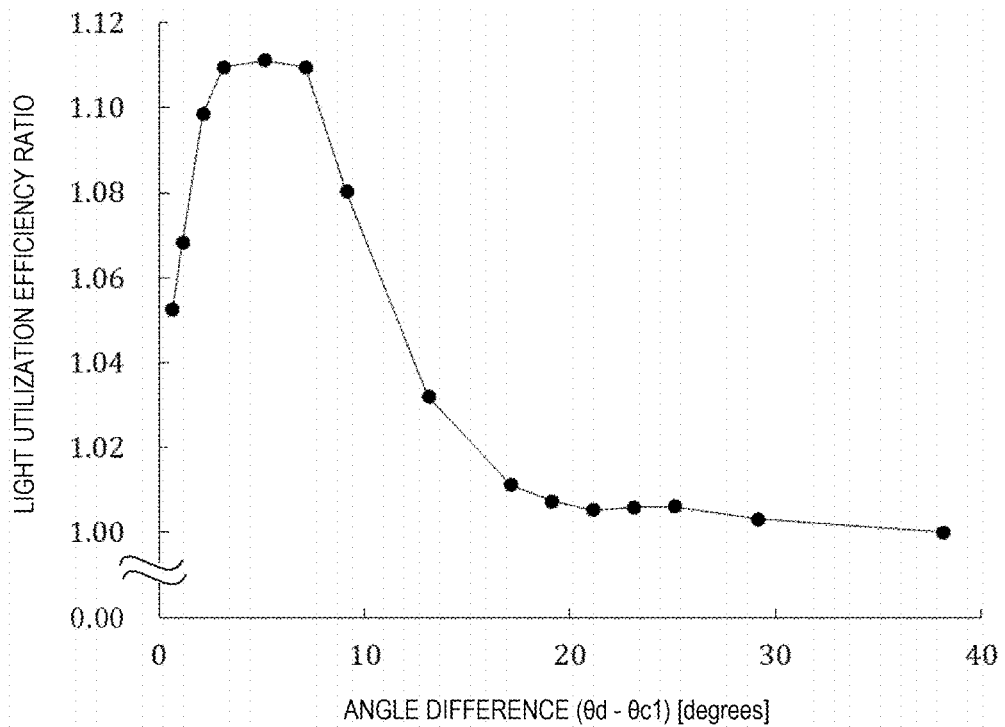
[FIG. 23]
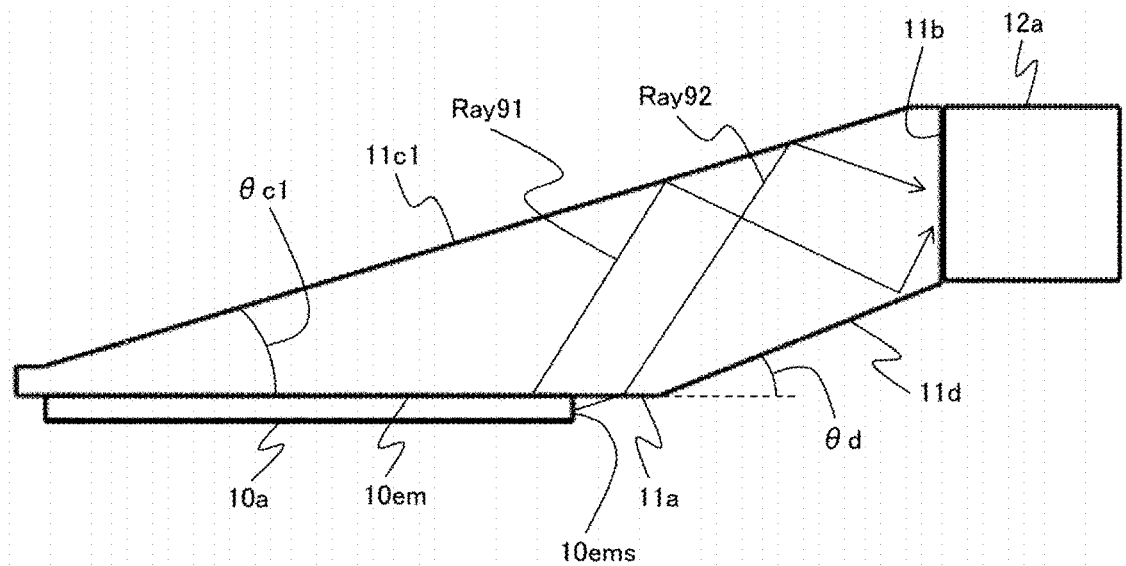

[FIG. 24]
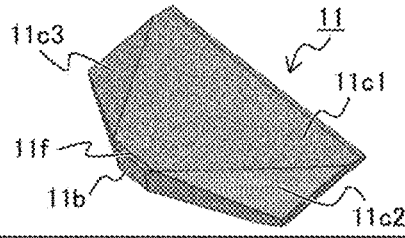

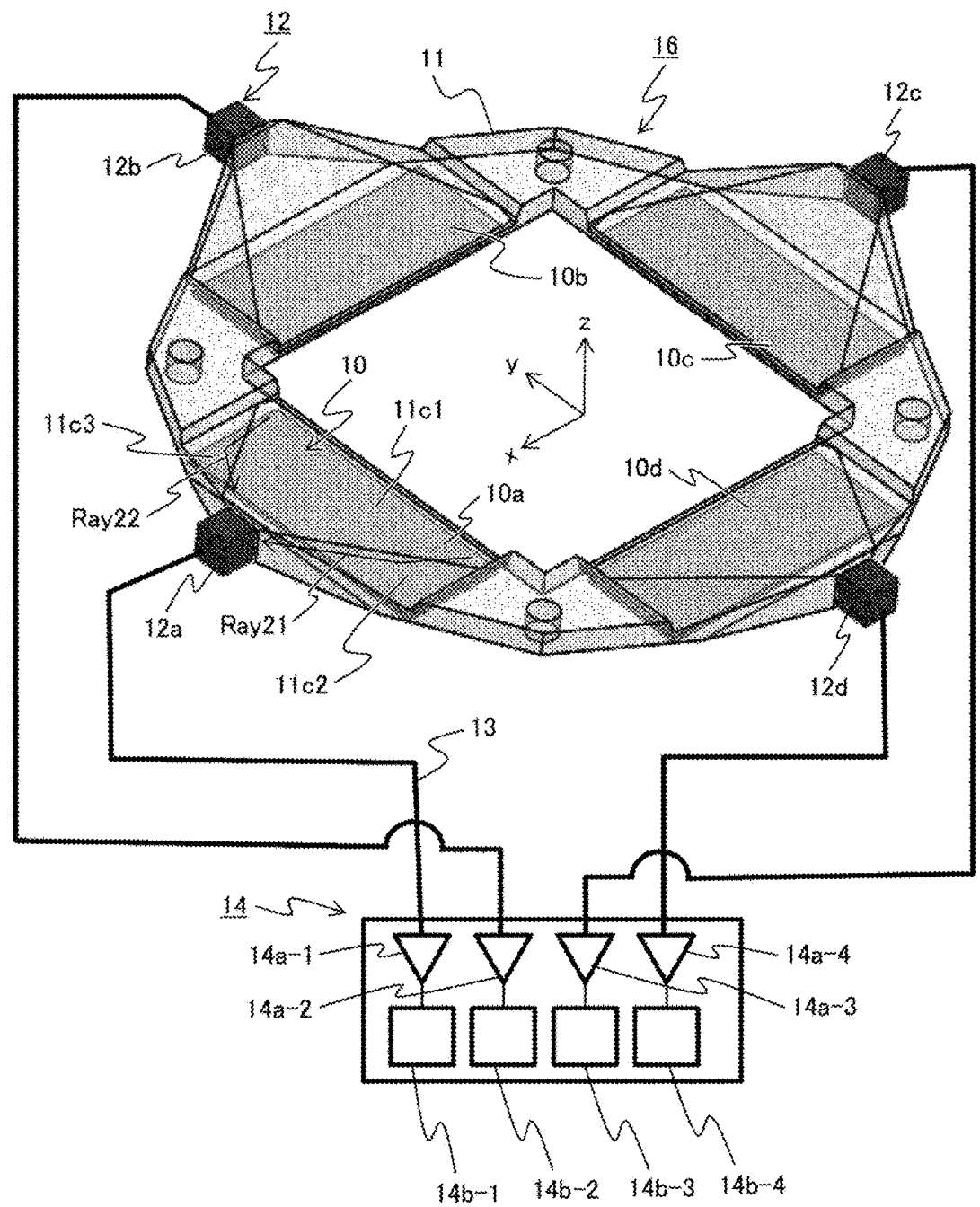
[FIG. 25]

[FIG. 26]
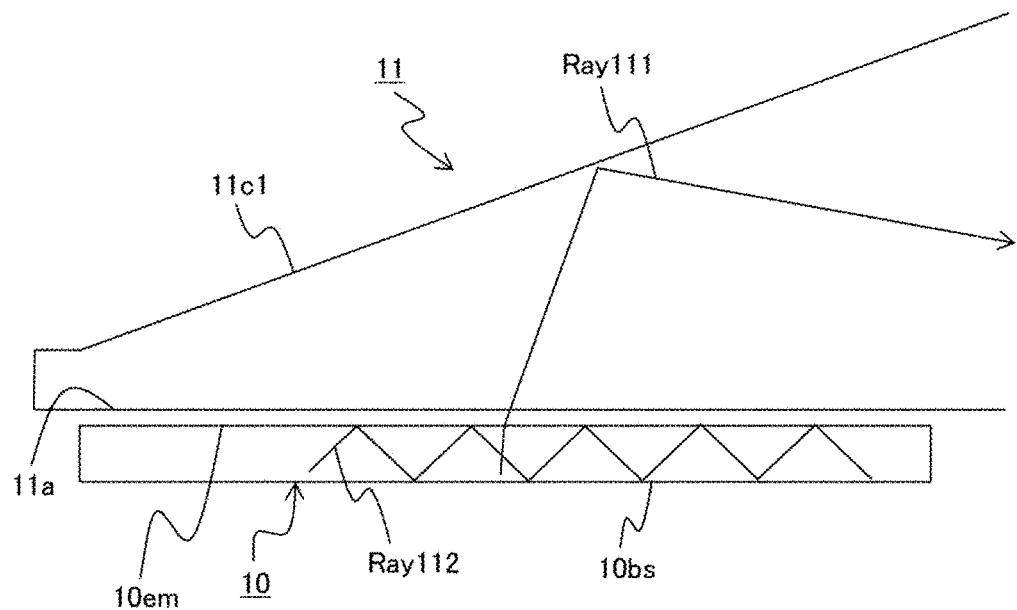
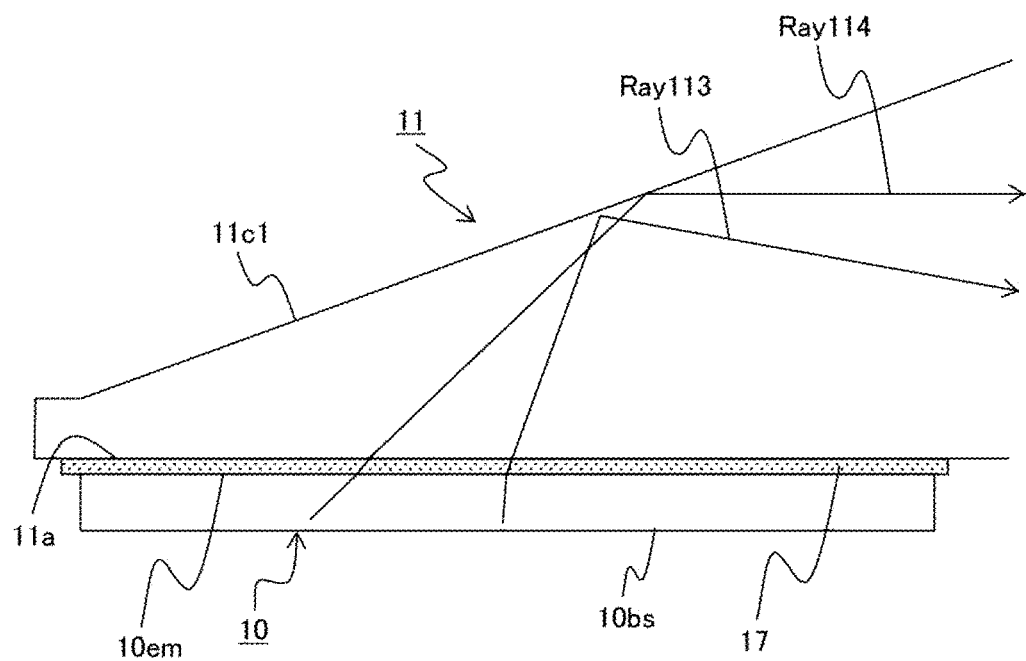

CHARGED PARTICLE BEAM APPARATUS

TECHNICAL FIELD

The present invention relates to a charged particle beam apparatus, and more particularly, to a charged particle beam apparatus including a light guide that guides light to a light receiving element with high efficiency.

BACKGROUND ART

A charged particle beam apparatus, which detects charged particles obtained by irradiating a sample with charged particle beams such as electron beams, includes a detector that detects the charged particles. For example, the detector includes a charge detection element such as a scintillator that captures a second charged particle generated by irradiating a sample with a charged particle beam and converts the second charged particle into light, a light receiving element that converts the light emitted by the charge detection element into an electrical signal, and a light guide that propagates the emitted light of the charge detection element to the light receiving element. The electrical signal output from the light receiving element is an image signal or a waveform signal.

In recent years, various detectors have been proposed according to a detection target. For example, in a case of a scanning electron microscope used as an evaluating and measuring device of a semiconductor device, since a structure of the semiconductor device such as memory are becoming 3D, there is a need to measure bottom dimensions of holes and grooves on a semiconductor substrate with high accuracy to improve a yield.

In a measurement using the scanning electron microscope, the charged particle beam with which the sample is irradiated is an electron beam, which is referred to as a primary electron beam in the present specification. The second charged particle generated by irradiation with the primary electron beam is an electron, which is referred to as a signal electron in the present specification. When the sample is irradiated with the primary electron beam, the signal electrons having various types of energy are emitted in various directions by interaction between the electrons and the sample.

In general, the signal electrons are roughly classified depending on energy thereof, signal electrons emitted with energy of 50 eV or less are referred to as secondary electrons, and signal electrons emitted with energy that is closer to energy of the primary electron beam and is larger than 50 eV are referred to as reflected electrons. For example, NPL 1 discloses that the secondary electrons are sensitive to a surface shape and potential of a sample and are effective for measuring dimensions of a surface structure such as a pattern width of a semiconductor device structure. However, the secondary electrons cannot escape from holes and grooves due to being absorbed by side walls of a 3D structure such as the holes and the grooves, and detection and measurement cannot be performed.

On the other hand, PTL 1 discloses that the reflected electron contains information on a composition or a solid shape of the sample, so that information such as a 3D structure or a difference in the composition between a surface and a bottom can be obtained. Since the reflected electron has high energy, the reflected electron can escape from a hole and a groove through a side wall, so that detection and measurement can be performed on a signal from a bottom of a structure of the hole and the groove.

As described above, since the signal electrons have various types of energy and are emitted in various directions, various detectors are required depending on the energy of the signal electrons and the like.

For example, PTL 2 describes a ring detector, and PTL 3 describes a detector including a light guide provided with a bent portion.

CITATION LIST

Patent Literature

PTL 1: JP-A-2015-106530
PTL 2: U.S. Pat. No. 7,928,383
PTL 3: JP-A-2017-183126

Non-Patent Literature

NPL 1: L. Reimer, Scanning Electron Microscopy (1998, Springer)

SUMMARY OF INVENTION

Technical Problem

In order to detect signal electrons with high efficiency by a detector, it is necessary to receive as many second charged particles as possible by the charge detection element, and to efficiently transmit the light emitted by the charge detection element to the light receiving element. For a former, by increasing an area of the charge detection element, more second charged particles can be received. The latter can be improved by improving light utilization efficiency of a light guide optical system. When the area of the charge detection element is increased, a light emitting area of the charge detection element also increases. On the other hand, in terms of an area of the light receiving element, a space for disposing the detector is limited and a large area light receiving element suitable for applications has not been put into practical use, so that it may be necessary to use a light receiving element having a small light receiving area. In such a case, it is necessary to receive the light emitted from a large light emitting surface of the charge detection element on a small light receiving surface of the light receiving element.

Since light guides in the related art do not take this into consideration, the light guides do not have a shape for collecting light from a large-area light emitting surface to a small-area light receiving surface. Because of this, there is a problem that light incident on the light guide from the large-area light emitting surface leaks from the light guide before reaching the small-area light receiving surface without propagating, and the light utilization efficiency (a ratio of light that reaches the light receiving element to light that is emitted from the charge detection element) is low.

Therefore, the invention provides a charged particle beam apparatus using a light guide that can improve light utilization efficiency.

Solution to Problem

In order to solve the above problems, a charged particle beam apparatus according to the invention is a charged particle beam apparatus including: a detector configured to detect at least one of a charged particle emitted from a sample by irradiation with a charged particle beam emitted from a charged particle source and a charged particle generated by collision of the charged particle emitted from the sample with another member. The detector includes a scintillator configured to emit light when the charged particle is incident, a light receiving element configured to convert the light into an electrical signal, and a light guide configured to guide the light generated from the scintillator to the light receiving element. The light guide includes: an incident surface that faces a light emitting surface of the scintillator and to which the light emitted by the scintillator is incident; an emitting surface that faces the light receiving element and is configured to emit light; and a reflecting surface that faces the incident surface and is inclined with respect to the incident surface so that the light incident from the incident surface is reflected toward a direction of the emitting surface. The emitting surface is smaller than the incident surface. A slope surface is provided between the incident surface and the emitting surface, faces the reflecting surface, and is inclined with respect to the incident surface.

A charged particle beam apparatus according to the invention is a charged particle beam apparatus including: a detector configured to detect at least one of a charged particle emitted from a sample by irradiation with a charged particle beam emitted from a charged particle source and a charged particle generated by collision of the charged particle emitted from the sample with another member. The detector includes a scintillator configured to emit light when the charged particle is incident, a light receiving element configured to convert the light into an electrical signal, and a light guide configured to guide the light generated from the scintillator to the light receiving element. The light guide includes: an incident surface that faces a light emitting surface of the scintillator and to which the light emitted by the scintillator is incident; an emitting surface that faces the light receiving element and is configured to emit light; and a reflecting surface that faces the incident surface and is inclined with respect to the incident surface so that the light incident from the incident surface is reflected toward a direction of the emitting surface. The emitting surface is smaller than the incident surface. The reflecting surface is formed of a plurality of surfaces, and covers at least a part of the light emitting surface of the scintillator.

A charged particle beam apparatus according to the invention is a charged particle beam apparatus including: a detector configured to detect at least one of a charged particle emitted from a sample by irradiation with a charged particle beam emitted from a charged particle source and a charged particle generated by collision of the charged particle emitted from the sample with another member. The detector includes a scintillator configured to emit light when the charged particle is incident, a light receiving element configured to convert the light into an electrical signal, and a light guide configured to guide the light generated from the scintillator to the light receiving element. The light guide includes: an incident surface that faces a light emitting surface of the scintillator and to which the light emitted by the scintillator is incident; an emitting surface that faces the light receiving element and is configured to emit light; a reflecting surface that faces the incident surface and is inclined with respect to the incident surface so that the light incident from the incident surface is reflected toward a direction of the emitting surface; and an upper surface provided between the reflecting surface and the emitting surface at an inclination angle different from that of the reflecting surface. The emitting surface is smaller than the incident surface. In a cross section including the scintillator, the light guide, and the light receiving element, a projection length of the reflecting surface to a surface parallel to the incident surface is larger than a projection length of the upper surface to the surface parallel to the incident surface.

A charged particle beam apparatus according to the invention is a charged particle beam apparatus including: a detector configured to detect at least one of a charged particle emitted from a sample by irradiation with a charged particle beam emitted from a charged particle source and a charged particle generated by collision of the charged particle emitted from the sample with another member. The detector includes a scintillator configured to emit light when the charged particle is incident, a light receiving element configured to convert the light into an electrical signal, and a light guide configured to guide the light generated from the scintillator to the light receiving element. The light guide includes: an incident surface that faces a light emitting surface of the scintillator and to which the light emitted by the scintillator is incident; an emitting surface that faces the light receiving element and is configured to emit light; and a reflecting surface that faces the incident surface and is inclined with respect to the incident surface so that the light incident from the incident surface is reflected toward a direction of the emitting surface. The emitting surface is smaller than the incident surface. A cross-sectional area when the light guide is cut parallel to the emitting surface becomes smaller as a cross section approaches the emitting surface.

Advantageous Effect

According to the invention, the charged particle beam apparatus using the light guide that can improve light utilization efficiency can be provided.

Problems to be solved, configurations and effects other than those described above will be clarified by description of the following embodiments.

BRIEF DESCRIPTION OF DRAWINGS

FIG. 1 is a schematic configuration diagram of a scanning electron microscope according to a first embodiment which is one embodiment of the invention.

FIG. 2 is a perspective view of a detector shown in FIG. 1.

FIG. 3 is a top view of the detector shown in FIG. 1 when viewed from above.

FIG. 4 is a bottom view of the detector shown in FIG. 1 when viewed from below.

FIG. 5 is a side view of the detector shown in FIG. 1.

FIG. 6 is a cross-sectional view taken along a line A-A' in an upper view of FIG. 2.

FIG. 7 is an external perspective view of the detector.

FIG. 8 is a cross-sectional view taken along a line B-B' in FIG. 7.

FIG. 9 is a perspective view of a detector using a light guide whose reflecting surface is formed of one flat surface.

FIG. 10 is a top view and a bottom view of the detector shown in FIG. 9 when viewed from above and below.

FIG. 11 is a cross-sectional view of the detector shown in FIG. 9 along an x axis.

FIG. 12 is a diagram showing a calculation result of angle θc1 dependence of a light utilization efficiency ratio.

FIG. 13 is another cross-sectional view taken along the line B-B' in FIG. 7.

FIG. 14 shows a perspective view and a front view of the light guide when viewed from above.

FIG. 15 shows a perspective view and a side view of the light guide shown in FIG. 14 when viewed from below.

FIG. 16 shows a perspective view and a front view of the light guide when viewed from above when an angle θc2 between an incident surface 11a and the reflecting surface is 90 degrees.

FIG. 17 shows a perspective view and a front view of the light guide when viewed from above when an angle θc2 is reduced until a reflecting surface 11c2 and a reflecting surface 11c3 reach an emitting surface 11b.

FIG. 18 is a diagram showing a calculation result of angle θc2 dependence of the light utilization efficiency ratio.

FIG. 19 shows a perspective view and a front view of the light guide when viewed from above.

FIG. 20 shows a perspective view and a side view of the light guide shown in FIG. 19 when viewed from below.

FIG. 21 is a side view of the light guide when an angle θd is changed.

FIG. 22 is a diagram showing a calculation result of angle difference (θd−θc1) dependence of the light utilization efficiency ratio.

FIG. 23 is a side view of the light guide.

FIG. 24 is a diagram showing a modification of the reflecting surface of the light guide.

FIG. 25 is a schematic configuration diagram of a detector according to a second embodiment which is another embodiment of the invention.

FIG. 26 is an enlarged view of a scintillator and a light guide constituting a detector according to a third embodiment which is another embodiment of the invention.

DESCRIPTION OF EMBODIMENTS

Hereinafter, a charged particle beam apparatus including a detector that uses a scintillator as a charge detection element and a light guide between the scintillator and a light receiving element will be described with reference to the drawings and the like. Hereinafter, an electron microscope, particularly a scanning electron microscope, will be described as an example of the charged particle beam apparatus, but the invention is not limited to this. For example, as the charged particle beam apparatus, a scanning ion microscope using an ion beam is also used. It is needless to say that the invention is also applicable to a measurement apparatus, an inspection apparatus, an observation apparatus, and the like of a semiconductor pattern that uses the scanning electron microscope.

The scintillator in the present specification refers to an element that emits light by incidence of charged particles. The scintillator in the present specification is not limited to the scintillator shown in the embodiments described in the following, and may have various shapes and structures.

First Embodiment

FIG. 1 is a schematic configuration diagram of a scanning electron microscope according to a first embodiment which is one embodiment of the invention. As shown in FIG. 1, in the scanning electron microscope, which is an aspect of the charged particle beam apparatus, an electron source 2 serving as a charged particle source is disposed inside an electron microscope barrel 1 which is a vacuum environment, and a primary electron beam (charged particle beam) emitted from the electron source 2 flies along a primary electron beam optical axis 3. The primary electron beam is converged on a sample 8 by an objective lens including a coil 5, an outer magnetic path 6, and an inner magnetic path 7 inclined with respect to the primary electron beam optical axis 3. A negative voltage is applied to the sample 8, and the primary electron beam collides with the sample 8 with energy smaller than energy generated by the electron source 2. A signal electron 9 generated from the sample 8 by the irradiation with the primary electron beam flies in the electron microscope barrel 1 according to emission energy and emission angles.

A scintillator 10 serving as the charge detection element is disposed inside any of members constituting the objective lens (in the present embodiment, inside the outer magnetic path 6). When the signal electron 9 collides with the scintillator 10, the scintillator 10 emits light, and the light is guided to a light receiving element 12 by a light guide 11. The scintillator 10 is disposed above the inner magnetic path 7 and below a deflector 4.

The scintillator 10 may be a substance that emits light due to incidence of charged particles (signal electrons 9), for example, may be a single crystal such as YAP ($YAlO_4$:Ce) or YAG ($Y_3Al_5O_{12}$:Ce), and may be a scintillator using powder such as yttrium, silicate, cerium ($Y_2SiO_5$:Ce), a semiconductor (GaN, Si, SiC), or the like. An example of a semiconductor scintillator is a GaN-based multilayer thin film structure such as a scintillator having a quantum well structure in which InGaN and GaN are stacked as a light emitting portion. However, the invention is not limited to a type of the scintillator.

As a material of the light guide 11, polymethyl methacrylate resin (PMMA resin), cycloolefin polymer (COP) resin, silica, quartz, or the like may be used. However, the invention is not limited to a material.

The light receiving element 12 is formed of, for example, a photomultiplier tube (PMT), a photodiode, or a silicon photomultiplier (Si-PM). However, the invention is not limited to a type of the light receiving element.

The light is guided inside of the light guide 11 and reaches the light receiving element 12. The light is converted into an electrical signal by the light receiving element 12, and the electrical signal is transmitted by an output cable 13 to a signal processing circuit 14 disposed outside the electron microscope barrel 1. The electrical signal is amplified into an electrical signal having a large amplitude by an amplifying circuit 14a on the signal processing circuit 14, is processed by an arithmetic circuit 14b as a contrast of an image according to a magnitude and a frequency of the electrical signal per unit time, and is displayed on a monitor 15 as pixels having a predetermined gradation value.

The signal electron 9 is detected while the deflector 4 scans the sample 8 with the primary electron beam, and an enlarged two-dimensional image of a sample surface is displayed on the monitor 15.

The present embodiment shows a case where a second charged particle is the signal electron 9 and the signal electron 9 emitted from the sample 8 reaches the scintillator 10 without colliding with other members. However, the signal electron 9 may collide with other members, plate materials, or the like (not shown) and reach the scintillator 10. Charged particles after colliding with other members or plate materials may be referred to as third charged particles. However, in order to simplify the description, the particle emitted from the sample 8 before being incident in the scintillator 10 will be referred to as the second charged particle, and in the present embodiment, the particle will be referred to as the signal electron 9.

In the present embodiment, a system including the scintillator 10, the light guide 11, and the light receiving element 12 is referred to as a detector 16. The scintillator 10 according to the present embodiment is disposed inside any of the members constituting the objective lens (in the present embodiment, inside the outer magnetic path 6), is further disposed below the deflector 4, and is disposed at a position where a reflected electron, that is, the signal electron 9 emitted from the sample 8 with energy close to the energy of the primary electron beam can be detected with high efficiency.

The reflected electron contains information on a composition or a solid shape of the sample, so that information such as a 3D structure or a difference in the composition between a surface and a bottom can be obtained. Since the reflected electron has high energy, the reflected electron can escape from a hole and a groove through a side wall, so that detection and measurement can be performed on a signal from a bottom of a structure of the hole and the groove. However, since the reflected electrons generally generate fewer electrons than secondary electrons, it is required to detect as many reflected electrons as possible.

Here, an electron emission angle is defined as 90 degrees in a direction along the primary electron beam optical axis 3 with respect to the sample surface. According to an emission angle of the reflected electron, a reflected electron at an emission angle approximate to 90 degrees is defined as a high-angle reflected electron, a reflected electron at an emission angle approximate to 45 degrees is defined as a medium-angle reflected electron, and a reflected electron at an emission angle approximate to 0 degrees is defined as a low-angle reflected electron.

Among the reflected electrons, more medium-angle reflected electrons are emitted as compared with the high-angle reflected electrons and the low-angle reflected electrons. As shown in FIG. 1, the position of the scintillator 10 is a position at which the reflected electron at a medium angle or less flying at an angle tilted from the primary electron beam optical axis 3 can be detected with high efficiency.

The detector 16 will be described with reference to FIGS. 2 to 6. FIG. 2 is a perspective view of the detector 16, and an upper view of FIG. 2 is a view in which the light guide 11 is made transparent similarly to an actual light guide so that the scintillator 10 under the light guide can be seen. A lower view of FIG. 2 is an external perspective view of the detector 16. For convenience, an orthogonal coordinate system including x, y, z in FIG. 2 is defined.

On the detector 16 according to the present embodiment, the scintillators 10 (10*a* to 10*d*) and the light receiving elements 12 (12*a* to 12*d*) are disposed in four directions which are ±x directions and ±y directions. A set number is not limited to 4 and may be 1, 2, 8 or 16, and the invention is not limited to the set number. Generally, as the set number increases, a total area of the scintillator 10 becomes large and the number of the light receiving elements 12 increases, so that it is easier to detect a large number of the signal electrons 9.

A hole 11*s* is formed between the adjacent scintillators 10 for fixing the light guide 11 to the electron microscope. A chance that the emitted light of the scintillator 10 hits this position is small, and by disposing a structural member at this position, it is possible to reduce an influence of the structural member on light utilization efficiency.

The light guide 11 according to the present embodiment, which will be described in detail below, has a configuration in which most of the light emitted from a certain scintillator reaches the light receiving element corresponding to the scintillator. For example, the light emitted from the scintillator 10*a* reaches the light receiving element 12*a*. Between the set of scintillators 10*a* and the light receiving element 12*a*, the light guide 11 that propagates the light emitted from the scintillator 10*a* to the light receiving element 12*a* is provided. In FIG. 2, three more similar sets including a set of the scintillator 10*b* and the light receiving element 12*b*, a set of the scintillator 10*c* and the light receiving element 12*c*, and a set of the scintillator 10*d* and the light receiving element 12*d* are further provided.

The scintillator 10*a*, the light receiving element 12*a*, and the corresponding light guide 11 shape may be separated as one detector. However, in the present embodiment, the light guide 11 has the same shape in four directions, and each of the four shapes individually propagates light from the scintillator 10 to the corresponding light receiving element 12. The light guide shapes are connected by connection portions 11*t*. A thickness of the connection portion 11*t* is a member having a thickness of 1 mm or more so as to improve a structural strength.

FIG. 3 is a top view showing the same detector 16 when viewed from above (z direction side), FIG. 4 is a bottom view showing the same detector 16 when viewed from below (−z direction side), and FIG. 5 is a side view showing the same detector 16 when viewed from a side (y direction side). In any one of the views, an upper view is a view when the light guide 11 is transparent similarly to the actual light guide, and a lower view is an external view.

FIG. 6 is a cross-sectional view taken along a line A-A' in the upper view of FIG. 2. As shown in FIG. 6, a surface of the light guide facing a light emitting surface 10*em* constituting the scintillator 10 is an incident surface 11*a*, and the light emitted from the scintillator 10 is mainly incident in the light guide 11 from the incident surface 11*a*. The incident surface 11*a* covers at least a part of the scintillator 10. Based on a viewpoint of the light utilization efficiency, it is desirable that the incident surface 11*a* covers an entire surface of the scintillator 10. An emitting surface 11*b* is a surface facing the light receiving element 12, and the light is emitted from the emitting surface 11*b*. The emitting surface 11*b* is smaller than the incident surface 11*a*. That is, an area of the emitting surface 11*b* is smaller than an area of the incident surface 11*a*.

The light guide 11 has a reflecting surface 11*c*1 that faces the incident surface 11*a* and inclines at an angle $\theta c1$. Hereinafter, the angle $\theta c1$ may be referred to as a reflecting surface angle $\theta c1$. The reflecting surface 11*c*1 is inclined so as to reflect the light incident from the incident surface 11*a* in a direction of the emitting surface 11*b*. The light emitted from the light emitting surface 10*em* of the scintillator 10 is incident in the light guide 11 from the incident surface 11*a*, and is reflected by the reflecting surface 11*c*1. In order to reflect a large amount of light toward the emitting surface 11*b* of the light guide, the reflecting surface 11*c*1 covers the most part of the light emitting surface 10*em* of the scintillator 10. By providing the reflecting surface 11*c*1, the light utilization efficiency (an amount of light reaching the light receiving element 12/an amount of emitted light of the scintillator 10) is improved.

As shown in the upper view of FIG. 2 and the upper view of FIG. 3, the reflecting surface is formed of a plurality of surfaces. Specifically, the scintillator 10 is entirely covered by three reflecting surfaces (11*c*1 to 11*c*3), and the light emitted from the scintillator 10 is reflected toward the emitting surface 11*b* by these reflecting surfaces (11*c*1 to 11*c*3), so that the light is used effectively. By using the reflecting surfaces (11*c*1 to 11*c*3) formed of a plurality of surfaces, the light utilization efficiency can be further improved.

Since the reflecting surface 11*c*1 reflects light propagating from a portion of the incident surface 11*a* close to the light receiving element 12, among the three reflecting surfaces (11c1 to 11c3), the reflecting surface 11c1 is an important reflecting surface by which most of the reflected light reaches the light receiving element 12. Therefore, it is most important to optimize the angle θc1 of the reflecting surface 11c1 for maximizing the light utilization efficiency.

Optimization of the angle θc1 will be described with reference to FIGS. 7 to 13. To simplify the problem, a structure having only the reflecting surface 11c1 is examined. FIG. 7 is an external perspective view of the detector. FIG. 8 is a cross-sectional view taken along a line B-B' in FIG. 7. The optimization is performed by calculating the light utilization efficiency when the angle θc1 is gradually reduced from 45 degrees using a light ray tracing simulation while keeping a light guide thickness $t_c$ constant.

In an examination in FIG. 7, the material of the light guide 11 is PMMA resin, and the reflecting surface 11c1, a side surface 11e1 and a side surface 11e2 are aluminum-deposited aluminum surfaces. A metal applied to the reflecting surface 11c1, the side surface 11e1 and the side surface 11e2 as a reflective material is not limited to aluminum, and may be silver or the like. A method of applying the reflective material such as aluminum to the surface is not limited to vapor deposition, and a film-shaped reflective material may be attached. The corresponding method is not particularly limited.

In the present embodiment, the light guide is formed using the reflecting surface formed of a plurality of surfaces, but the reflecting surface may be formed of one surface. FIG. 9 shows a detector using a light guide whose reflecting surface is formed of one flat surface. An upper view of FIG. 9 is a view in which the light guide 11 is made transparent similarly to the actual light guide, so that the scintillator 10 under the light guide can be seen. A lower view of FIG. 9 is an external perspective view of the detector 16. For convenience, an orthogonal coordinate system including x, y, z with a center of the detector 16 as an origin is defined in FIG. 9. Light receiving elements 12 (12a to 12d) are disposed in an x axis direction and a y axis direction. An upper view of FIG. 10 is a top view of the detector 16 when viewed from above (z direction side), and a lower view of FIG. 10 is a bottom view of the detector 16 when viewed from below (−z direction side). FIG. 11 is a cross-sectional view of the detector 16 shown in FIG. 9 along the x axis. As shown in the lower view of FIG. 9 and the upper view of FIG. 10, the reflecting surface 11c1 is one flat surface. Even in this case, effects other than an effect of forming the reflecting surface into a multi-faceted shape or a curved surface shape can be attained as in the present embodiment.

Since it is checked in advance that an upper surface 11f facing the incident surface 11a and substantially parallel to the incident surface 11a as shown in FIG. 7 has a small change in efficiency even as the aluminum surface, the upper surface 11f is not an aluminum surface but a PMMA resin surface. Even when the upper surface 11f is the aluminum surface, the light is reflected toward the incident surface 11a since the upper surface 11f is parallel to the incident surface 11a. Therefore, even when the upper surface 11f is the aluminum surface, the light utilization efficiency does not improve significantly.

A view in an upper part of FIG. 8 is a cross-sectional view when the angle θc1 is 42 degrees, and in this cross section, the reflecting surface 11c1 partially covers the scintillator 10. Since an outer shape of the scintillator 10 is rectangular and a depth direction is entirely covered by the reflecting surface 11c1, a covering ratio is expressed by $d_c/L_{sc}$ using a scintillator length $L_{sc}$ and a projection length $d_c$ to the surface (or scintillator light emitting surface 10em) parallel to the incident surface of the reflecting surface 11c1. When the angle θc1 is reduced, $d_c/L_{sc}$ approaches 1, and when the reflecting surface 11c1 completely covers the scintillator 10 in this cross section, $d_c/L_{sc}$ becomes 1. When the angle θc1 is further reduced, $d_c/L_{sc}$ exceeds 1. In the present specification, as shown in the upper part of FIG. 8, even when the reflecting surface 11c does not cover a lower slope surface 11d, in a case where the reflecting surface 11c and the lower slope surface 11d are substantially parallel, it is assumed that the reflecting surface and the lower slope surface face each other.

A view in a middle part of FIG. 8 is a cross-sectional view when the angle θc1 is 25 degrees, and in this cross section, the reflecting surface 11c1 completely covers the scintillator 10. A view in a lower part of FIG. 8 is a cross-sectional view when the angle θc1 is 18 degrees, and shows a case where the reflecting surface 11c1 reaches the emitting surface 11b.

FIG. 12 is a diagram showing a calculation result of angle θc1 dependence of a light utilization efficiency ratio. A horizontal axis is the angle θc1, and a vertical axis is the light utilization efficiency ratio standardized by the optical utilization efficiency when the angle θc1 is 45 degrees. Based on this result, it can be seen that as the angle θc1 decreases, the light utilization efficiency becomes higher. A reason for this result will be described with reference to an upper view of FIG. 13 and a lower view of FIG. 13. As shown in the upper view of FIG. 13, when the upper surface 11f substantially parallel to the incident surface 11a is present, a light ray Ray72 incident to the upper surface 11f passes through the upper surface 11f and is emitted to an outside of the light guide 11, and becomes lost light that does not reach the light receiving element 12a. Therefore, it is important to dispose the reflecting surface 11c1 such that the reflecting surface 11c1 covers the scintillator 10a and reflect the light toward the emitting surface 11b by the reflecting surface. Further, since light propagating in a direction inclined as a light ray Ray75 in the lower view of FIG. 13 escapes from the upper surface 11f which does not face the scintillator 10a, it is desirable that the reflecting surface 11c1 reaches the emitting surface 11b, and all the surface opposite to the incident surface 11a is inclined as the reflecting surface to reflect light toward the emitting surface 11b. By using the inclined reflecting surface, the reflecting surface 11c1 reflects, for example, a light ray Ray71, a light ray Ray73, and a light ray Ray74 to the emitting surface 11b, which has the effect of improving the light utilization efficiency.

The upper surface 11f is the PMMA resin surface. However, even when the upper surface 11f is the aluminum surface, since the upper surface 11f is parallel to the incident surface 11a, most of the incident light is not reflected toward the emitting surface 11b and becomes stray light, thereby resulting in lost light. Therefore, even when the upper surface 11f is the aluminum surface, the light utilization efficiency is improved by reducing the reflecting surface angle θc1.

The optimization of the reflection surface angle θc1 is described above. The configuration shown in FIGS. 7 and 8 is an optical system in which the light emitted from the large-area light emitting surface 10em reaches a small-area light receiving surface of the light receiving element 12 using the light guide 11. In this optical system, the optimization of the most important reflecting surface 11c1 that reflects the light propagating from the part of the incident surface 11a close to the light receiving element 12 is described.

The reflecting surface 11c1 covers the scintillator 10, and is a surface inclined with respect to the incident surface 11a to reflect the light incident from the incident surface 11a in the direction of the emitting surface 11b, so that the effect of improving the light utilization efficiency is achieved. The reflecting surface 11c1 covers at least a part of the scintillator 10 as shown in the view in the upper part of FIG. 8, so that the effect is achieved.

Further, as shown in the view in the middle part of FIG. 8, in a cross section (for example, a B-B' cross section) that includes the scintillator 10, the light guide 11, and the light receiving element 12, when the reflecting surface 11c1 covers the entire scintillator 10, the effect is further achieved.

Further, as shown in the view in the lower part of FIG. 8, in the cross section that includes the scintillator 10, the light guide 11, and the light receiving element 12, the reflecting surface 11c1 reaches the emitting surface 11b, so that the light utilization efficiency is maximized. However, in the actual light guide, as shown in the view in the lower part of FIG. 8, when a connection portion between the emitting surface 11b and the reflecting surface 11c1 is made an acute angle, the connection portion is cracked or chipped. In order to avoid this, as shown in the lower view of FIG. 2, the lower view of FIG. 3, and FIG. 6, a small upper surface 11f is provided between the emitting surface 11b and the reflecting surface 11c1. Therefore, in reality, a structure provided with the small upper surface 11f is a structure that maximizes the light utilization efficiency.

In other words, regarding the structure of FIG. 6, in the cross section that includes the scintillator 10, the light guide 11, and the light receiving element 12, it can be said that the projection length dc of the reflecting surface 11c1 to the surface parallel to the incident surface 11a (or the light emitting surface 10em of the scintillator) is longer than the length du of the upper surface 11f, and this configuration improves the light utilization efficiency. Since the length du of the upper surface 11f is approximately 0.5 mm to 3 mm, which is a length required to prevent the upper surface 11f from cracking and chipping, in reality, it can be said that the configuration in which the length du of the upper surface 11f is 3 mm or less maximizes the light utilization efficiency. In the present embodiment, the upper surface 11f may be set as a surface parallel to the incident surface 11a. However, the upper surface 11f may be set as an inclined surface. In this case, the length du of the upper surface 11f may be a projection length of the upper surface 11f to a surface parallel to the incident surface 11a (or the light emitting surface 10em of the scintillator), and the projection length may be approximately 0.5 mm to 3 mm.

Another structure that preventing cracking or chipping of the light guide 11 is a lower surface 11g shown in the lower view of FIG. 2, the lower view of FIG. 3, and FIG. 6. Similar to the upper surface 11f, the lower surface 11g is also a surface disposed to prevent the reflection surface 11c1 and the incident surface 11a from directly connecting and forming an acute-angled portion. The lower surface 11g is a surface that is connected to an end portion of the reflecting surface 11c1 on a side opposite to the emitting surface 11b and is disposed at an angle (an angle parallel to the incident surface 11a in FIG. 6) different from the reflecting surface 11c1. In the present embodiment, the lower surface 11g and the upper surface 11f are flat surfaces parallel to the incident surface 11a. However, the invention is not limited to this, and may be, for example, a curved surface.

Next, the reflecting surface 11c2 and the reflecting surface 11c3 will be described. The reflecting surface 11c1 is a surface that reflects the light propagating from the portion of the incident surface 11a close to the light receiving element 12 toward the emitting surface 11b. In contrast, the reflecting surface 11c2 and the reflecting surface 11c3 are surfaces that reflects light emitted from an end of the scintillator 10 toward the emitting surface 11b. Therefore, inclinations of the reflecting surface 11c2 and the reflecting surface 11c3 are different from that of the reflecting surface 11c1.

In the upper view of FIG. 2, the reflecting surface 11c2 and the reflecting surface 11c3 corresponding to the scintillator 10a and the light receiving element 12a will be described as an example. The reflecting surface 11c2 and the reflecting surface 11c3 are inclined so as to reflect the light emitted from the end portion of the scintillator 10a toward the light receiving element 12a. A light ray Ray21 and a light ray Ray22 in the upper view of FIG. 2 are examples of light rays that are emitted from the end portion of the scintillator 10a and are reflected by the reflecting surface 11c2 and the reflecting surface 11c3 toward the light receiving element 12a.

Normal directions of the reflecting surface 11c2 and the reflecting surface 11c3 corresponding to the scintillator 10a and the light receiving element 12a will be described. In order to reflect the light emitted from the end portion of the scintillator in the ±y direction toward the light receiving element 12a, it is necessary to reflect the light so that a propagation direction of the light also changes in the y direction. The light ray Ray21 and the light ray Ray22 are reflected so as to change propagation directions thereof in the +y and −y directions, respectively.

When u is a unit vector from a position where the light is reflected to a position where the light is incident, and v is a unit vector from the position where the light is reflected to a position where the light is emitted, since a normal line of the reflecting surface is a half vector $(u+v)/|u+v|$ of the unit vectors u and v, in order to reflect the light in the y direction, the normal line also needs a component in the y direction. That is, since the unit vector v includes a y component, the normal line also includes the component in the y direction. The normal line of the reflecting surface 11c1 includes zero components in the y direction, but the normal lines of the reflecting surface 11c2 and the reflecting surface 11c3 include the component in the y direction. In other words, the normal lines of the reflecting surface 11c2 and the reflecting surface 11c3 are perpendicular to the emitting surface 11b and the incident surface 11a, and have a normal component in a direction toward a flat surface (an x-z surface in the upper view of FIG. 2) including a center of the emitting surface 11b.

Relation between the structures of the reflecting surface 11c2 and the reflecting surface 11c3 and the light utilization efficiency will be described with reference to FIGS. 14 to 17. FIG. 7 shows four sets of the scintillator 10, the light receiving element 12, and the light guide 11 that propagate light therebetween, and in this examination, the light utilization efficiency is calculated for one of these sets. FIGS. 14 to 17 show a calculation model obtained by cutting out the scintillator 10a, the light receiving element 12a, and the corresponding light guide 11 from the four sets shown in FIG. 7. This model has a shape for maximizing the light utilization efficiency with respect to the angle θc1, and has a shape in which the reflecting surface 11c1 extends to the emitting surface 11b.

FIGS. 14 and 15 are the light guides 11 having the same shape, an upper view of FIG. 14 is a perspective view when viewed from above, and a lower view of FIG. 14 is a front view when viewed from front (x direction). An upper view of FIG. 15 is a perspective view when viewed from below, and a lower view of FIG. 15 shows a side view when viewed from a side (y direction side). For the structures of the reflecting surface 11c2 and the reflecting surface 11c3, an influence on the efficiency is examined by changing the structure while changing an angle θc2 between the incident surface 11a and the reflecting surface when viewed from front. When the angle θc2 is 90 degrees, the reflecting surface 11a is only the reflecting surface 11c1 as shown in a perspective view and a front view shown in an upper view and a lower view of FIG. 16. The light utilization efficiency is calculated by reducing the angle θc2 until the reflecting surface 11c2 and the reflecting surface 11c3 reach the emitting surface 11b, as shown in a perspective view and a front view shown in an upper view and a lower view of FIG. 17.

In examinations in FIGS. 14 to 17, the material of the light guide 11 is PMMA resin, and the reflecting surface 11c1 to the reflecting surface 11c3, the side surface 11e1 and the side surface 11e2 are aluminum-deposited aluminum surfaces.

FIG. 18 shows a result of calculating the light utilization efficiency. A horizontal axis is the angle θc2, and a vertical axis is the light utilization efficiency ratio standardized by the optical utilization efficiency when the angle θc2 is 90 degrees. Based on this result, it can be seen that as the angle decreases, the efficiency becomes higher. That is, the light utilization efficiency is maximized when the reflecting surface 11c2 and the reflecting surface 11c3 reach the emitting surface 11b (as the shape shown in FIG. 17). It can also be seen that the light utilization efficiency is sharply improved when the angle is 40 degrees or less.

Therefore, the reflecting surface of the light guide 11 is not formed of one reflecting surface, but is formed of a plurality of reflecting surfaces having different inclination directions according to a position of the scintillator 10, so that the effect of improving the light utilization efficiency is achieved.

At this time, the normal line of the reflecting surface that reflects the light emitted from the end portion of the scintillator 10a to the light receiving element 12a is perpendicular to the emitting surface 11b and the incident surface 11a, and has the normal component in the direction toward the flat surface including the center of the emitting surface 11b. The angle θc2 between the incident surface 11a and the reflecting surface when the reflecting surface 11c2 and the reflecting surface 11c3 are viewed from front is made smaller, so that the effect of improving the light utilization efficiency is achieved, and an effect of sharply improving the efficiency is achieved when the angle θc2 is smaller than 40 degrees. Further, the efficiency is maximized when the angle θc2 is reduced until the reflecting surface 11c2 and the reflecting surface 11c3 reach the emitting surface 11b.

However, in reality, when the reflecting surface 11c2 and the reflecting surface 11c3 are connected to the emitting surface 11b, the connection portion becomes an acute angle, and cracking or chipping occurs. Therefore, as shown in FIGS. 2 and 3, the upper surface 11f is provided between the reflecting surface 11c2 and the reflecting surface 11c3 and the emitting surface 11b to alleviate the cracking or chipping. Therefore, in reality, it can be said that the structure in which the reflecting surface 11c2 and the reflecting surface 11c3 reach the upper surface 11f is the structure in which the efficiency is maximized due to the reflecting surface 11c2 and the reflecting surface 11c3.

When there is a combination of a plurality of scintillators 10 and the light receiving elements 12 as shown in FIGS. 2 and 7, a combination of the emitting surface 11b and the incident surface 11a described in the description of FIGS. 14 to 17 corresponds to a nearest combination as described with reference to FIG. 2 or 7, or refers to the emitting surface 11b and the incidence surface 11a of the light guide 11 corresponding to one set of the scintillator 10 and the light receiving element 12.

Next, the lower slope surface 11d shown in FIGS. 4 to 6 will be described. The lower slope surface 11d is a surface that re-reflects the light reflected mainly by the reflecting surfaces 11c1 to 11c3, is disposed between the incident surface 11a and the emitting surface 11b, and faces the reflecting surface 11c1. In FIG. 6, a light ray Ray2 and a light ray Ray3 are examples of being reflected by the lower slope surface 11d and reaching the light receiving element 12. Each of the light rays reaches the light receiving element 12 while repeating reflection between the reflecting surface 11c1 and the lower slope surface 11d, so that the light propagates through a normal light guide plate (PMMA flat plate).

A reason why such a light ray propagation path occurs is that the light guide in FIG. 6 has a configuration in which the reflecting surface 11c1 roughly reaches the emitting surface 11b, and by setting the lower slope surface 11d to an appropriate inclined angle, a rectangular parallelepiped light guide plate formed of two upper and lower flat surfaces can be simulated in a pseudo manner and light can reach the light receiving element 12 while repeating the reflection.

A general light guide plate is a rectangular parallelepiped, so that the light incident from a certain side surface is guided toward a side surface facing the certain side surface while repeating total reflection on the upper surface and the lower surface, and is emitted from the side surface facing the incident surface. On the other hand, in the present embodiment, since light is not incident from the side surface of the rectangular parallelepiped, by using the reflecting surface 11c1 as the aluminum surface, the light that is to pass through the reflecting surface 11c1 without being totally reflected is also reflected by the metal surface. The same applies to the lower slope surface 11d. When the lower slope surface 11d formed of the aluminum surface is used instead of the lower slope surface 11d formed of a resin surface, the light that cannot be totally reflected, that passes through the surface, and that is lost can be reduced, so that the light utilization efficiency is improved. According to a calculation, in the light guide 11 having the structure shown in FIG. 6, when the lower slope surface 11d is the aluminum surface, the light utilization efficiency is improved by 5% to 10% as compared with a case of the resin surface. Therefore, by using the lower slope surface 11d formed of the aluminum surface, the effect of improving the light utilization efficiency is achieved. In the following examination of the present embodiment, the lower slope surface 11d is formed of the aluminum surface.

A shape of the lower slope surface 11d is optimized by changing an angle θd in FIG. 6 and calculating the efficiency. The optimization will be described with reference to FIGS. 19 to 23. The upper view of FIG. 2 shows four sets of the scintillator 10, the light receiving element 12, and the light guide 11 that propagates light therebetween. However, in this examination, the light utilization efficiency is calculated for one of these sets. FIGS. 19 to 23 show a calculation model obtained by cutting out the scintillator 10a, the light receiving element 12a, and the corresponding light guide from the four sets shown in the upper view of FIG. 2. This model has a shape for preventing the shape of the light guide from becoming an acute angle and cracking or chipping of the light guide and for maximizing the light utilization efficiency with respect to the angle $\theta c1$ and the angle $\theta c2$, and has a shape in which the reflecting surface $11c1$, the reflecting surface $11c2$, and the reflecting surface $11c3$ extend to the upper surface $11f$.

In the present examination, the material of the light guide 11 is the PMMA resin, the three reflecting surfaces ($11c1$ to $11c3$), the side surface $11e1$ and the side surface $11e2$ are aluminum-deposited aluminum surfaces, and the upper surface $11f$ is also the aluminum surface. That is, the surfaces other than the incident surface $11a$ and the emitting surface $11b$ are the aluminum surfaces. Since the upper surface $11f$ is located at a position connected to the emitting surface $11b$ and at a position not facing the incident surface $11a$, and the light incident to the upper surface $11f$ is incident in the upper surface $11f$ at an angle inclined with respect to the upper surface $11f$, as long as the light can be reflected, the light propagates toward the emitting surface $11b$. Therefore, the aluminum surface is used, so that the light incident in the upper surface $11f$ at an angle smaller than a total reflection angle can also be reflected.

FIGS. 19 and 20 are the light guides 11 having the same shape, an upper view of FIG. 19 is a perspective view when viewed from above, and a lower view of FIG. 19 is a front view when viewed from front (x direction). An upper view of FIG. 20 is a perspective view when viewed from below, and a lower view of FIG. 20 shows a side view when viewed from a side (y direction side). The light utilization efficiency is calculated by changing the angle $\theta d$ shown in the lower view of FIG. 20. An upper view of FIG. 21 is a side view of the light guide 11 when the angle $\theta d$ is close to the angle $\theta c1$ of the reflecting surface $11c1$. A lower view of FIG. 21 is a side view of the light guide 11 when the angle $\theta d$ is increased in the present examination. Since a position of the emitting surface $11b$ is fixed, when the angle $\theta d$ is increased, the incident surface $11a$ becomes larger.

A result of the examination is shown in FIG. 22. A horizontal axis is a relative angle of the angle $\theta d$ with respect to the angle $\theta c1$. That is, an angle difference ($\theta d-\theta c1$) is shown. A vertical axis shows the light utilization efficiency ratio standardized by the light utilization efficiency when the angle difference ($\theta d-\theta c1$) is 38 degrees. When the angle difference ($\theta d-\theta c1$) is zero, the reflecting surface $11c1$ and the lower slope surface $11d$ are parallel. When the angle difference ($\theta d-\theta c1$) is positive, the angle $\theta d$ is larger than the angle $\theta c1$, and the lower slope surface $11d$ has a slope larger than that of the reflecting surface $11c1$.

Efficiency peaks when the angle difference ($\theta d-\theta c1$) is between approximate to 2 degrees and 8 degrees. When the angle difference ($\theta d-\theta c1$) is approximate to 20 degrees or more, almost no light ray, such as the light ray Ray2 and the light ray Ray3 shown in FIG. 6, reaches the light receiving element 12 while repeating the reflection between the reflecting surface $11c1$ and the lower slope surface $11d$, so that the light utilization efficiency ratio is approximate to 1. It is considered that the light utilization efficiency ratio is improved since the number of light rays that reach the light receiving element 12 by repeating the reflection increases as the reflecting surface $11c1$ and the lower slope surface $11d$ become closer to parallel, but in FIG. 22, the efficiency ratio decreases when the angle difference ($\theta d-\theta c1$) is 2 degrees or less.

A reason of decreasing of the efficiency ratio when the angle difference ($\theta d-\theta c1$) is 2 degrees or less will be described with reference to FIG. 23. As mentioned earlier, as the reflecting surface $11c1$ and the lower slope surface $11d$ become closer to parallel, the number of the light rays (light ray Ray91 in FIG. 23) that reach the light receiving element 12 by repeating the reflection increases. On the other hand, although it depends on a type of the scintillator 10, the scintillator 10 generally emits light from all surfaces on which a metal such as aluminum is not vapor-deposited. Therefore, the light is emitted not only from the light emitting surface $10em$ facing the incident surface $11a$ but also from a side surface $10ems$ of the scintillator 10. A ratio of a light emission amount Ip of the light emitting surface $10em$ to a light emission amount Is of the side surface $10ems$ changes according to a ratio of an area of the light emitting surface $10em$ to an area of the side surface $10ems$.

Here, since the scintillator 10 emits light not only from the light emitting surface $10em$ but also from the side surface $10ems$, a definition of the light emitting surface $10em$ according to the invention will be described. In order to capture the signal electrons 9, the light guide 11 according to the invention has a configuration in which the light emitted from the large-area surface of the scintillator 10 is collected on the emitting surface $11b$. Therefore, in the scintillator 10, among the surfaces of the scintillator 10 facing any surface of the light guide 11, a surface that emits light and has a largest area or a surface that emits light parallel to a surface that captures the flying signal electrons 9 is referred to as the light emitting surface. Characteristics of this light emitting surface are characteristics of the light emitting surface $10em$ shown in FIGS. 2 to 22.

In the scintillator 10, the light emitting surface $10em$ is defined as the surface that has the largest area and faces the light guide 11, and this is not just applied to the case of a single scintillator 10. For example, the scintillator $10a$ shown in FIG. 2 is one rectangular parallelepiped scintillator, but the scintillator $10a$ may be divided in an x-y surface and formed of a plurality of scintillators. Even in that case, an area of a surface parallel to the x-y surface (incident surface $11a$) of each scintillator is larger than an area of the other surfaces. However, when the number of divisions becomes larger than a certain level, the area of the side surface may be larger than the area of the surface parallel to the x-y surface, and in that case, the surface that emits light parallel to the surface that captures the flying signal electrons 9 may be referred to as the light emitting surface.

In the present embodiment, the shape of the scintillator 10 is a rectangular parallelepiped. However, the shape is not limited to this, various shapes such as a cube and a cylinder can be considered, and the invention is not limited to the shape of the scintillator.

The invention includes the incident surface $11a$ to which the light emitted from the scintillator 10 is incident, and the light incident from the incident surface $11a$ is guided to the emitting surface $11b$ by the reflecting surfaces ($11c1$ to $11c3$) or the like. Therefore, regardless of the shape of the light emitting surface $10em$ with respect to the incident surface $11a$, the light guide 11 has an effect of condensing the light incident in the light guide 11 from the incident surface $11a$ to the emitting surface $11b$.

For example, in a case where the scintillator 10 has a GaN-based multilayer thin film structure, an outer shape is a cylinder, a height is 0.5 mm, and a diameter of the circle is 9 mm, according to a simulation, Ip:Is=1:1. Even a technique of forming a pattern structure such as a pyramid or a cone inside the scintillator to improve the emission amount Ip of the light emitted from the light emitting surface $10em$ by diffraction or scattering is introduced, Ip:Is=7:3.

Therefore, it is also important to utilize the light from the side surface $10ems$. An example which is a light ray Ray92 shown in FIG. 23 is a light ray in which the light is emitted from the side surface $10ems$, is incident in the light guide 11 from the incident surface 11a, is reflected by the reflecting surface 11c1, and reaches the emitting surface 11b.

In the present examination, since the positions of the emitting surface 11b and the scintillator 10 are fixed, when the angle θd is reduced, an end portion of the incident surface 11a connected to the lower slope surface 11d approaches the side surface 10ems of the scintillator. When the end portion of the incident surface 11a approaches the side surface 10ems, an area for the light emitted from the side surface 10ems to be incident in the light guide 11 decreases, so that the light emitted from the side surface 10ems cannot be utilized, and the light utilization efficiency decreases. Therefore, when the angle θd is reduced, the number of the light rays (Ray91) that repeat the reflection increases. On the other hand, there is a trade-off that the light emitted from the side surface 10ems and incident in the light guide 11 is reduced. It is considered that a reason why the light utilization efficiency sharply decreases when the angle difference is 2 degrees or less in the result shown in FIG. 23 is that the light emitted from the side surface 10ems and incident in the light guide 11 starts to decrease remarkably.

The lower slope surface 11d is described above. The configuration shown in FIGS. 19 to 21 is an optical system in which the light emitted from the large-area light emitting surface 10em and the light emitted from the side surface 10ems reach the small-area light receiving surface of the light receiving element 12 using the light guide 11. The optimization of the lower slope surface 11d in this optical system is described.

When the angle difference between the reflecting surface 11c1 and the lower slope surface 11d is approximate to 20 degrees or less, the effect of improving the light utilization efficiency is achieved. Based on this point, in the present specification, the case where the angle difference between the reflecting surface 11c1 and the lower slope surface 11d is 20 degrees or less is referred to as a case where the reflecting surface 11c1 and the lower slope surface 11d are substantially parallel. The lower slope surface 11d is preferably substantially parallel to at least a part of the reflecting surface 11c1. When the reflecting surface is formed of a plurality of surfaces, it is preferable that the lower slope surface 11d is substantially parallel to one of the plurality of surfaces.

Furthermore, when the angle difference between the reflecting surface 11c1 and the lower slope surface 11d is set between 2 degrees and 8 degrees, the light utilization efficiency is maximized. Therefore, it is more preferable that the angle difference between the reflecting surface 11c1 and the lower slope surface 11d is 2 degrees or more and 8 degrees or less.

A certain distance is set between the side surface 10ems of the scintillator 10 and the end portion of the incident surface 11a, and based on another point of view, the angle θd of the lower slope surface 11d with respect to the incident surface is larger than the angle θc1 of the reflecting surface 11c1 with respect to the incident surface 11a, so that the light emitted from the side surface 10ems can be incident in the light guide 11, and the effect of improving the light utilization efficiency is achieved.

In the present embodiment, aluminum is attached to the surface of the light guide 11 to form the reflecting surface (aluminum surface), but the reflective material is not limited to aluminum. The reflecting surface is preferably a surface including a reflective material made of metal. As the reflective material, for example, silver, a multilayer reflective film, and the like can be used in addition to aluminum. A method of attaching the reflective material to the light guide 11 is not limited to vapor deposition, and there are various methods such as attachment. The invention is not limited to these methods.

In the configuration of the optical system shown in the present embodiment, that is, an optical system including the large-area light emitting surface, the light receiving surface (in the present embodiment, the angle between the light emitting surface and the light receiving surface is approximate to 90 degrees) that is not parallel to or faces the light emitting surface, and the light guide having a small thickness as compared to a size of the light emitting surface, since the light is emitted from the scintillator in all directions, the light is not necessarily totally reflected by the reflecting surface of the light guide. Therefore, it is better to attach the reflective material such as aluminum to the surface of the light guide as much as possible to increase an amount of the reflected light to the emitting surface.

In the case of the light guide according to the present embodiment, the light utilization efficiency is most improved when the reflective material is attached to the three reflecting surfaces (11c1 to 11c3), and the light utilization efficiency is secondarily improved when the reflective material is attached to the side surface 11e1 and side surface 11e2. Further, when the reflective material is attached to the lower slope surface 11d, the light utilization efficiency is improved by 5% to 10%. In the case of the light guide according to the present embodiment, the effect of improving the light utilization efficiency is achieved by appropriately attaching the reflective material to the surface.

Further, in the scintillator 10 according to the present embodiment shown in FIG. 6, a metal reflecting surface is attached to a surface 10bs (a surface of the scintillator 10 on a side opposite to the light emitting surface 10em) on a side opposite to the surface facing the incident surface 11a of the light guide 11. Specifically, the surface 10bs is a surface on which aluminum is vapor-deposited. After the light ray Ray3 is emitted from the scintillator 10, the light ray Ray3 is reflected by the surface 10bs and reaches the light receiving element 12. In this way, since there is a light ray path through which the light is reflected by the surface 10bs and reaches the light receiving element 12, by attaching the reflective material to the surface 10bs, the effect of improving the light utilization efficiency is achieved.

In the present embodiment, the reflective material is attached to three surfaces which are the reflecting surfaces (11c1 to 11c3), the side surface 11e1 and the side surface 11e2, and the lower slope surface 11d and the scintillator surface 10bs, and the portion where the light emitted from the scintillator 10 propagates to the light receiving element 12 is covered with the reflective material. The reflective material is not attached to the incident surface 11a, but aluminum serving as the reflective material is attached to the surface 10bs parallel to the incident surface 11a. In addition to the surface connected to the emitting surface 11b and the connection portion 11t, there is a surface that reflects light leaking to an outside to the light guide 11 again. Accordingly, the effect of improving the light utilization efficiency is achieved.

This scanning electron microscope is an example of the configuration, and other configurations can also be used as long as the electron microscope includes the scintillator 10, the light guide 11, and the light receiving element 12. For the sake of simplicity, only one detector is shown, but a plurality of detectors may be provided. A detector for reflected electron detection and a detector for secondary electron detection may be provided separately, and a plurality of detectors that distinguish and detect an azimuth angle or an elevation angle may be provided. By separately using these detectors, information on a surface shape, a composition, a 3D structure, and the like of the sample 8 can be obtained from an image by discriminating and detecting the signal electrons 9 depending on energy and the angle. As a method of energy discrimination, there is a method of changing a light emission amount or a light emission wavelength of the scintillator 10 according to energy of the reflected electrons and detecting the signal electron. In this method, by applying the invention as the light guide 11 having high light utilization efficiency, energy resolution can be increased.

<Modification>

A modification will be described with reference to FIG. 24. In the above-described embodiment, a shape of the reflecting surface is a combination of flat surfaces. However, the shape of the reflecting surface is not limited to this, and various shapes can be applied. A view in FIG. 24 in which the shape of the reflecting surface is a flat surface shows the light guide shown in the upper view of FIG. 19. When the shape of the reflecting surface is a curved surface, it is difficult to properly define the reflecting surface 11c1 to the reflecting surface 11c3, but the reflecting surfaces can be roughly defined as shown in the perspective view in FIG. 24 depending on a direction in which a normal line of the surface faces. It can be said that the curved surface has a shape in which a plurality of reflecting surfaces having different inclination directions are continuously connected. Regardless of whether the reflecting surface is a flat surface or a curved surface, the reflecting surface is a reflecting surface that is inclined with respect to the incident surface.

In the optical system in which the light emitted from the large-area light emitting surface 10em reaches the small-area light receiving surface of the light receiving element 12 using the light guide 11, regardless of whether the reflecting surface is a flat surface or a curved surface, a cross-sectional area when the light guide is cut parallel to the emitting surface 11b becomes smaller as the cross section approaches the emitting surface. FIG. 24 shows cross-sectional views of the light guide cut at positions of 0.5 mm, 1.0 mm, and 2.0 mm from the emitting surface. The cross section is a shaded area, and it can be seen that the cross-sectional area becomes smaller as the cross section approaches the emitting surface 11b. By the light guide 11 having such a shape, the light emitted from the large-area light emitting surface 10em can efficiently reach the small-area light receiving surface of the light receiving element 12.

As described above, according to the present embodiment, the charged particle beam apparatus using the light guide that can improve the light utilization efficiency can be provided.

Second Embodiment

FIG. 25 is a schematic configuration diagram of a detector according to a second embodiment which is another embodiment of the invention. The present embodiment is different from the first embodiment in that the signal processing circuit 14 that processes, for each light receiving element, the electrical signals output from the four light receiving elements 12 of the detection system 16 at high speed is provided. Other configurations are the same as those according to the first embodiment. The same components as those according to the first embodiment are denoted by the same reference numerals, and the description overlapping with the first embodiment will be omitted below.

As shown in FIG. 25, the light receiving elements 12 (12a to 12d) and the amplifying circuits 14a (14a-1 to 14a-4) are individually connected by the output cable 13. An amplitude of the electrical signal is individually amplified, and the electrical signal is processed by arithmetic circuits 14b (14b-1 to 14b-4) and displayed on the monitor 15 as pixels having a predetermined gradation value. This configuration is an example in which the arithmetic circuit 14b is parallelized and the signal processing is performed for each light receiving element 12 to increase a speed. By providing the amplifying circuits 14a individually, it is possible to adjust an amplification factor for each circuit and appropriately amplify the electrical signal. Therefore, by individually providing the amplifying circuit 14a and the arithmetic circuit 14b corresponding to the light receiving element 12, an effect of appropriately amplifying the electrical signal individually and performing the processing at a high speed is achieved.

However, the configuration is not limited to this, a switch (selector) that selects signals from the light receiving elements (12a to 12d), one or two amplifying circuits 14a, and the arithmetic circuit 14b may be provided to process the electrical signal by time division. A minimum function required for the signal processing circuit 14 according to the present embodiment is to individually process the electrical signals from the light receiving elements 12 (12a to 12d).

In the detector 16 according to the first embodiment described above, the scintillators 10 (10a to 10d) and the light receiving elements 12 (12a to 12d) are disposed in four directions. By individually processing the electrical signals obtained by the light receiving element 12 in this configuration, it is possible to discriminate the electrical signals in four directions. That is, it becomes clear that the signal electron 9 emitted from the sample 8 flies along the z axis and reaches the scintillator 10 in which direction. For example, in a case where a cylinder is observed, when an image is created based on the electrical signals acquired by the four-direction scintillators 10 (10a to 10d), a cylindrical image observed from each direction is obtained, and a shadow of the cylinder corresponding to the direction appears in the image. A height of the cylinder can be estimated based on a length of the shadow. At this time, the light guide 11 is not only provided with a plurality of sets of the scintillator 10 and the light receiving element 12, but also needs to cause the light emitted from a certain scintillator to reach a light receiving element corresponding to the scintillator.

The light guide 11 has a configuration in which most of the light emitted from the scintillator is propagated to the corresponding light receiving element. The configuration is an optical system in which the light emitted by the scintillators 10a, 10b, 10c, 10d is respectively propagated to the light receiving elements 12a, 12b, 12c, 12d.

The reflecting surface 11c2 and the reflecting surface 11c3 play an important role in preventing a phenomenon (light crosstalk) that the emitted light of the scintillator reaches an uncorresponding light receiving element. For example, the light directed from the scintillator 10a to the light receiving element 12b or the light receiving element 12d is mainly reflected by the reflecting surfaces 11c2, 11c3 and does not reach the light receiving element 12b or the light receiving element 12d. In other words, according to a configuration in which the cross-sectional area when the light guide is cut parallel to the emitting surface 11b becomes smaller as the cross section approaches the emitting surface, the light crosstalk is prevented. Therefore, even when the scintillator 10 is not divided and the detector is formed of one scintillator having a shape such as an annulus, the crosstalk can be reduced by the shape of the light guide.

According to the configuration of the detector 16 described in the first embodiment, by individually processing the electrical signal obtained by the light receiving element 12, 3D measurement such as estimation of the height of the cylinder can be performed. Therefore, the configuration includes one or a plurality of scintillators and a plurality of light receiving elements, and a light guide that propagates most of the light emitted by the scintillator to the light receiving elements corresponding to the directions such as upper, lower, left, and right on the sample, and the electrical signal of each light receiving element is individually processed, so that the 3D measurement can be performed.

The number of sets of the scintillator and the light receiving element is not limited to 4, and may be 2, 3, 8, or 16. However, when the number of sets is increased, a total number of signal electrons that can be acquired increases. However, since the number of signal electrons per set decreases, and adjacent light receiving elements are closer to one another, the light crosstalk is likely to occur. When an image is created for each set, noise of the image increases as the number of signal electrons per set decreases. Therefore, an optimum number of sets may be selected based on relation between a yield of the total number of signal electrons, the light crosstalk, and the number of signal electrons per set.

As described above, according to the present embodiment, in addition to the effects according to the first embodiment, it is possible to appropriately amplify the electrical signal individually and process the electrical signal at a high speed.

Third Embodiment

FIG. 26 is an enlarged view of a scintillator and a light guide that constitute a detector according to a third embodiment which is another embodiment of the invention. The present embodiment is different from the first embodiment in that the scintillator 10 and the light guide 11 are joined by a refractive index matching member 17. Other configurations are the same as those according to the first embodiment, the same components as those according to the first embodiment are denoted by the same reference numerals, and the description overlapping with the first embodiment will be omitted below.

In order to make the explanation easier to understand, an upper view of FIG. 26 shows an enlarged view of the scintillator and the light guide according to the above-described first embodiment, and a lower view of FIG. 26 shows an enlarged view of the scintillator and the light guide according to the present embodiment. Firstly, as shown in the upper view of FIG. 26, in the configuration of the detector according to the above-described first embodiment, the scintillator 10 and the incident surface 11a of the light guide are disposed close to each other, but are not bonded (joined). Therefore, the light emitted from the scintillator 10 reaches the incident surface 11a of the light guide via air. A light ray Ray111 is an example of a light ray incident in the light guide 11, and is a light ray through which the light is emitted from an inside of the scintillator 10, is emitted from the scintillator light emitting surface 10em, and is incident in the light guide 11 via air. The signal electron 9 enters the scintillator 10 and the light is emitted from the inside of the scintillator. A part of the light emitted in the scintillator 10 cannot be emitted out of the scintillator 10 and is lost inside the scintillator. A major cause of this loss is total reflection occurred at an interface between the scintillator 10 and air.

When a scintillator made of a semiconductor or a ceramic phosphor material is used, or when a substrate on which a powder phosphor is formed is used as the scintillator 10 and light from the substrate is also extracted and utilized, a general refractive index of the scintillator light emitting surface 10em is often larger than 1.5. A total reflection angle on the scintillator surface when the refractive index is 1.5 is approximately 40 degrees. Therefore, a proportion of the total reflection at the surface of the light emitted inside is approximate to 75% or more of the light incident on the surface. When there is a scattered structure inside the scintillator, the totally reflected light may change a propagation angle to be incident in the surface again and be emitted out of the scintillator 10, but a part of the totally reflected light is totally reflected again, and the light returns to the inside of the scintillator and is absorbed. A light ray Ray112 is an example of a light ray absorbed in the scintillator. Since a metal such as aluminum is attached to the surface 10bs of the scintillator as the reflective material, energy of the light is absorbed each time the light is reflected. The light ray Ray112 is emitted from the inside of the scintillator, is totally reflected by the light emitting surface 10em, and is reflected while being absorbed by the surface 10bs. The light ray Ray112 is an example of the light that is lost due to repeating of this process and the energy of the light becomes almost zero.

Due to a loss mechanism of this total reflection, a ratio of the light emitted from the scintillator 10 to the light emitted inside the scintillator is considered to be approximate to less than 60%, and according to a simulation, the ratio is approximate to 5% to 30% depending on the structure.

The total reflection angle is determined by a difference between a refractive index of the material of the scintillator light emitting surface 10em and the refractive index of air. Accordingly, as shown in the lower view of FIG. 26, in the configuration of the detector according to the present embodiment, a refractive index matching member 17 having a higher refractive index than air is disposed between the scintillator light emitting surface 10em and the incident surface 11a of the light guide 11. The refractive index matching member 17 according to the present embodiment is an acrylic resin adhesive layer that bonds the scintillator light emitting surface 10em and the incident surface 11a. The scintillator light emitting surface 10em and the incident surface 11a are bonded by the acrylic resin adhesive layer, so that air is prevented from entering a space between the scintillator light emitting surface 10em and the incident surface 11a. The refractive index matching member 17 is not limited to the acrylic resin, and may be a transparent member such as an epoxy resin. An elastic body such as rubber may be sandwiched between the scintillator 10 and the light guide 11, or the scintillator 10 may be attached to the light guide 11 with a double-sided tape.

When the refractive index of the refractive index matching member 17 is higher than that of air, the total reflection is less likely to occur between the scintillator light emitting surface 10em and the refractive index matching member 17, so that the light emitted inside the scintillator is likely to be incident in the refractive index matching member 17 from the light emitting surface 10em. When the refractive index of the refractive index matching member 17 is equal to or higher than a refractive index of the light guide 11, the total reflection does not occur, and even when the refractive index of the light guide 11 is substantially the same as that of the refractive index matching member 17, the total internal reflection is less likely to occur. Therefore, by disposing the refractive index matching member 17 having a refractive index equal to or higher than that of the light guide 11, since the light is likely to be incident in the refractive index matching member 17 from the scintillator light emitting surface 10em, and the light is likely to be incident in the light guide 11 from the refractive index matching member 17, the effect of improving the light utilization efficiency is achieved. An extent of the refractive index similar to that of the light guide 11 refers to approximately ±0.2 of the refractive index of the light guide 11. Specifically, when the light guide is PMMA having a refractive index of 1.51, the refractive index of the refractive index matching member 17 is approximate to 1.31 to 1.71.

However, since the refractive index of any material is higher than that of air, the refractive index matching member 17 made of resin or the like is disposed so that there is no air layer between the scintillator light emitting surface 10em and the incident surface 11a, thereby achieving the effect of improving the light utilization efficiency. At this time, the light emitted from the scintillator 10 may pass through the refractive index matching member 17. At this time, for example, even when an absorption coefficient $[m^{-1}]$ of the material is high, there is no problem since light passes through the refractive index matching member 17 when the refractive index matching member 17 is sufficiently thin. What is important for the refractive index matching member 17 is that the light passes through the refractive index matching member 17. It is better that a transmittance of the refractive index matching member 17 is higher. However, it is sufficient that the light can pass through the refractive index matching member 17, and any resin such as acrylic resin or epoxy resin can transmit the light without any problem. For example, a member that does not transmit the light at all, such as a thick metal plate, cannot be used as the refractive index matching member 17.

When the refractive index of the refractive index matching member 17 is a refractive index between the refractive index of the scintillator light emitting surface 10em and the refractive index of the light guide 11, a sum of a refractive index difference between the light emitting surface 10em of the scintillator 10 and the refractive index matching member 17 and a refractive index difference between the refractive index matching member 17 and the light guide 11 is the minimum (refractive index difference between the scintillator light emitting surface 10em and the light guide 11), and a fresnel reflection that occurs depending on the refractive index difference is minimized, so that the effect of improving the light utilization efficiency is achieved.

In such an example, when the scintillator is a GaN-based multilayer thin film structure, since a material of the scintillator light emitting surface 10em is a sapphire substrate, the refractive index is approximate to 1.78 at a wavelength of 400 nm. On the other hand, a refractive index of PMMA is approximate to 1.51. Therefore, it is desirable that the refractive index of the refractive index matching member 17 is between these two refractive indexes, and for example, an acrylic resin adhesive or an epoxy resin adhesive having a refractive index of approximate to 1.6 may be used as the refractive index matching member 17.

The effect of the refractive index matching member 17 is checked by a simulation. The GaN-based multilayer thin film structure is used as the scintillator 10, and the light utilization efficiency is calculated when the refractive index matching member 17 is provided and when the refractive index matching member 17 is not provided. As a result, the light utilization efficiency when the refractive index matching member 17 is provided is 1.8 times of the light utilization efficiency when the refractive index matching member 17 is not provided.

In a case where the light guide is a typical rectangular parallelepiped, when the light is incident in the light guide, the light is refracted and spread of the light in the light guide becomes less than approximately 40 degrees. Accordingly, the light propagating in the light guide repeats the total reflection on a surface orthogonal to the incident surface, so that the light is guided. However, when the light source and the light guide are connected by the refractive index matching member, since the light emitted from the light source is incident in the light guide with almost no refraction, the light does not propagate in the light guide and leaks from the light guide near the incident surface. That is, in the case where the light guide is the typical rectangular parallelepiped, when the light is guided into the refractive index matching member 17, the light utilization efficiency decreases.

In the structure in which the three reflecting surfaces (11c1 to 11c3) are aluminum surfaces as the light guide described in the above-described first embodiment, a cross-sectional area when the light guide 11 is cut parallel to the emitting surface 11b is smaller as a cross section approaches the emitting surface 11b. In this case, since the light is focused on the light receiving element 12 by reflection even when the light emitted by the scintillator 10 remains spread and is incident in the light guide 11, the light lost in the scintillator 10 is taken out without loss by introducing the refractive index matching member 17, so that the effect of improving the light utilization efficiency is achieved.

That is, by disposing the refractive index matching member 17 between the light guide 11 and the scintillator 10 that have the characteristics described in the above-described first embodiment, the effect of improving the light utilization efficiency is achieved.

At that time, the refractive index of the refractive index matching member 17 may be set to a refractive index equal to or higher than the refractive index of the light guide, and it is even better that the refractive index is between the refractive index of the scintillator light emitting surface 10em and the refractive index of the light guide 11.

As described above, according to the present embodiment, in addition to the effect according to the first embodiment, the light utilization efficiency can be further improved.

The invention is not limited to the above-mentioned embodiments, and includes various modifications. For example, the above embodiments have been described in detail for easy understanding of the invention, and the invention is not necessarily limited to those including all the described configurations. A part of a configuration according to one embodiment can be replaced with a configuration according to another embodiment, and a configuration according to another embodiment can be added to a configuration according to one embodiment.

REFERENCE SIGN LIST

1 . . . electron microscope barrel, 2 . . . electron source, 3 . . . primary electron beam optical axis, 4 . . . deflector, 5 . . . coil, 6 . . . outer magnetic path, 7 . . . inner magnetic path, 8 . . . sample, 9 . . . signal electron, 10 . . . scintillator, 11 . . . light guide, 12 . . . light receiving element, 13 . . . output cable, 14 . . . signal processing circuit, 14a . . . amplifying circuit, 14b . . . arithmetic circuit, 15 . . . monitor, 16 . . . detector, 17 . . . refractive index matching member

The invention claimed is:

1. A charged particle beam apparatus, comprising:
a detector configured to detect at least one of a charged particle emitted from a sample by irradiation with a charged particle beam emitted from a charged particle source and a charged particle generated by collision of the charged particle emitted from the sample with another member, wherein
the detector includes a scintillator configured to emit light when the charged particle is incident, a light receiving element configured to convert the light into an electrical signal, and a light guide configured to guide the light generated from the scintillator to the light receiving element,
the light guide includes
an incident surface that faces a light emitting surface of the scintillator and to which the light emitted by the scintillator is incident,
an emitting surface that faces the light receiving element and is configured to emit light, and
a reflecting surface that faces the incident surface and is inclined with respect to the incident surface so that the light incident from the incident surface is reflected toward a direction of the emitting surface,
the emitting surface is smaller than the incident surface, and
a slope surface is provided between the incident surface and the emitting surface, faces the reflecting surface, and is inclined with respect to the incident surface.

2. The charged particle beam apparatus according to claim 1, wherein
the slope surface is substantially parallel to at least a part of the reflecting surface.

3. The charged particle beam apparatus according to claim 1, wherein
the reflecting surface is formed of a plurality of surfaces, and covers at least a part of the light emitting surface of the scintillator.

4. The charged particle beam apparatus according to claim 1, wherein
the reflecting surface is formed of a plurality of surfaces, and covers at least a part of the light emitting surface of the scintillator, and
the slope surface is substantially parallel to one of the plurality of surfaces of the reflecting surface.

5. The charged particle beam apparatus according to claim 1, wherein the reflecting surface extends from the incident surface to the emitting surface.

6. The charged particle beam apparatus according to claim 1, further comprising:
an upper surface provided between the reflecting surface and the emitting surface at an inclination angle different from that of the reflecting surface, wherein
in a cross section including the scintillator, the light guide, and the light receiving element, a projection length of the reflecting surface to a surface parallel to the incident surface is larger than a projection length of the upper surface to the surface parallel to the incident surface.

7. The charged particle beam apparatus according to claim 1, wherein
a cross-sectional area when the light guide is cut parallel to the emitting surface becomes smaller as a cross section approaches the emitting surface.

8. The charged particle beam apparatus according to claim 1, wherein
the scintillator and the light guide are joined by a refractive index matching member that transmits the emitted light of the scintillator.

9. The charged particle beam apparatus according to claim 1, wherein
the reflecting surface is a surface containing a reflective material made of metal.

10. The charged particle beam apparatus according to claim 1, wherein
the light guide is disposed inside any member constituting an objective lens of an electro-optical system.

11. The charged particle beam apparatus according to claim 1, wherein
the light guide covers the entire light emitting surface of the scintillator.

12. The charged particle beam apparatus according to claim 1, wherein
the incident surface covers the entire light emitting surface of the scintillator.

13. A charged particle beam apparatus, comprising:
a detector configured to detect at least one of a charged particle emitted from a sample by irradiation with a charged particle beam emitted from a charged particle source, and a charged particle generated by collision of the charged particle emitted from the sample with another member, wherein
the detector includes a scintillator configured to emit light when the charged particle is incident, a light receiving element configured to convert the light into an electrical signal, and a light guide configured to guide the light generated from the scintillator to the light receiving element,
the light guide includes
an incident surface that faces the light emitting surface of the scintillator and to which the light emitted by the scintillator is incident,
an emitting surface that faces the light receiving element and is configured to emit light, and
a reflecting surface that faces the incident surface and is inclined with respect to the incident surface so that the light incident from the incident surface is reflected toward a direction of the emitting surface,
the emitting surface is smaller than the incident surface,
a cross-sectional area when the light guide is cut parallel to the emitting surface becomes smaller as a cross section approaches the emitting surface, and an opposite surface of the light emitting surface of the scintillator is a metal reflecting surface.

* * * * *